(12) United States Patent
Shimizu

(10) Patent No.: US 8,410,811 B2
(45) Date of Patent: Apr. 2, 2013

(54) INPUT CIRCUIT AND SEMICONDUCTOR STORAGE DEVICE

(75) Inventor: Yuui Shimizu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 13/191,825

(22) Filed: Jul. 27, 2011

(65) Prior Publication Data

US 2012/0025865 A1 Feb. 2, 2012

(30) Foreign Application Priority Data

Jul. 28, 2010 (JP) ................. 2010-168863

(51) Int. Cl.
*H03K 19/0175* (2006.01)
*H03K 19/00* (2006.01)
(52) U.S. Cl. .......................... 326/16; 326/83
(58) Field of Classification Search .......... None
See application file for complete search history.

(56) References Cited

U.S. PATENT DOCUMENTS

| 5,521,531 | A | * | 5/1996 | Okuzumi | 326/81 |
| 5,534,798 | A | * | 7/1996 | Phillips et al. | 326/108 |
| 6,163,174 | A | * | 12/2000 | Friedman et al. | 326/108 |
| 6,281,711 | B1 | * | 8/2001 | Horiguchi et al. | 326/121 |

FOREIGN PATENT DOCUMENTS

| JP | 5-14173 | 1/1993 |
| JP | 5-183421 | 7/1993 |
| JP | 5-327461 | 12/1993 |
| JP | 8-107345 | 4/1996 |
| JP | 10-336013 | 12/1998 |
| JP | 2005-160073 | 6/2005 |

OTHER PUBLICATIONS

J. Zerbe, et al., "Equalization and Clock Recovery for a 2.5-10Gb/s 2-PAM/4-PAM Backplane Transceiver Cell", ISSCC 2003, Session 4, Clock Recovery and Backplane Transceivers, Paper 4.6, IEEE International Solid-State Circuits Conference, Feb. 10, 2003, 10 pages.

* cited by examiner

*Primary Examiner* — Crystal L Hammond
(74) *Attorney, Agent, or Firm* — Oblon, Spivak, McClelland, Maier & Neustadt, L.L.P.

(57) ABSTRACT

According to one embodiment, an input circuit includes an input buffer, a control unit, a holding unit, a feedback unit. The input buffer receives a signal input from an outside. The input buffer includes a plurality of CMOS inverters connected in parallel. The plurality of CMOS inverters includes a plurality of PMOS transistors and a plurality of NMOS transistors. The control unit selects one or more PMOS transistors from the plurality of PMOS transistors so as to enter an operable state. The control unit selects one or more NMOS transistors from the plurality of NMOS transistors so as to enter an operable state. The holding unit holds a level of a signal transferred from the input buffer in synchronization with a clock signal. The holding unit outputs the held signal level. The feedback unit feeds the level of the signal output from the holding unit back to the control unit.

20 Claims, 15 Drawing Sheets

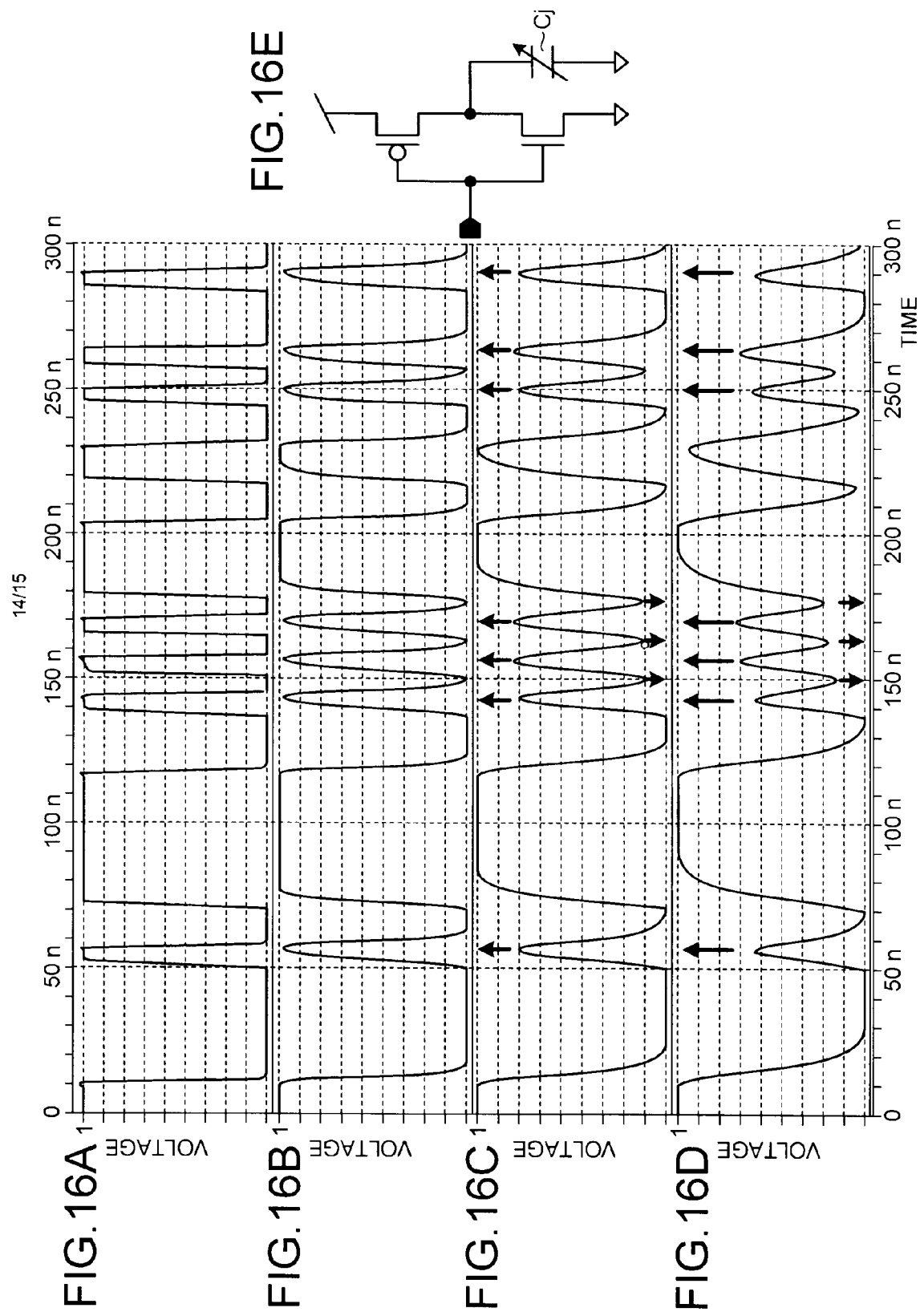

Rout=25 ohm

Rout=18 ohm

INPUT CIRCUIT AND SEMICONDUCTOR STORAGE DEVICE

CROSS-REFERENCE TO RELATED APPLICATIONS

This application is based upon and claims the benefit of priority from the prior Japanese Patent Application No. 2010-168863, filed on Jul. 28, 2010; the entire contents of which are incorporated herein by reference.

FIELD

Embodiments described herein relate generally to an input circuit and a semiconductor storage device.

BACKGROUND

In NAND flash memories or an input circuit of the controller thereof, a plurality of CMOS inverters connected in parallel are used as an input buffer. With an increasing demand for high speed operation of the input buffer, the effect of a parasitic capacitance such as a junction capacitance at the output node where the drains of PMOS and NMOS transistors which constitute an output circuit are connected has increased to a level so as not to be negligible. That is, it takes time to charge/discharge the junction capacitance when a signal is transferred to the input buffer, and this causes inter-symbol interference that a past signal level interferes with a present signal level. Thus, the signal level tends to deteriorate due to the inter-symbol interference. In general, since NAND flash memories are used in a state where a plurality of NAND flash memory chips are stacked in a multi-chip package (MCP), the above effect is significant when data is transferred from a controller to the NAND flash memory chips.

BRIEF DESCRIPTION OF THE DRAWINGS

FIGS. 16A to 16E are views illustrating the operation of the input circuit according to the comparative example.

DETAILED DESCRIPTION

In general, according to one embodiment, there is provided an input circuit including an input buffer, a control unit, a holding unit, and a feedback unit. The input buffer receives a signal input from an outside. The input buffer includes a plurality of CMOS inverters connected in parallel to each other. The plurality of CMOS inverters includes a plurality of PMOS transistors and a plurality of NMOS transistors. The control unit selects one or more PMOS transistors from the plurality of PMOS transistors so as to enter an operable state. The control unit selects one or more NMOS transistors from the plurality of NMOS transistors so as to enter an operable state. The holding unit holds a level of a signal transferred from the input buffer in synchronization with a clock signal. The holding unit outputs the held signal level. The feedback unit feeds the level of the signal output from the holding unit back to the control unit.

Exemplary embodiments of an input circuit will be explained below in detail with reference to the accompanying drawings. The present invention is not limited to the following embodiments.

Embodiment

Figure 1A:
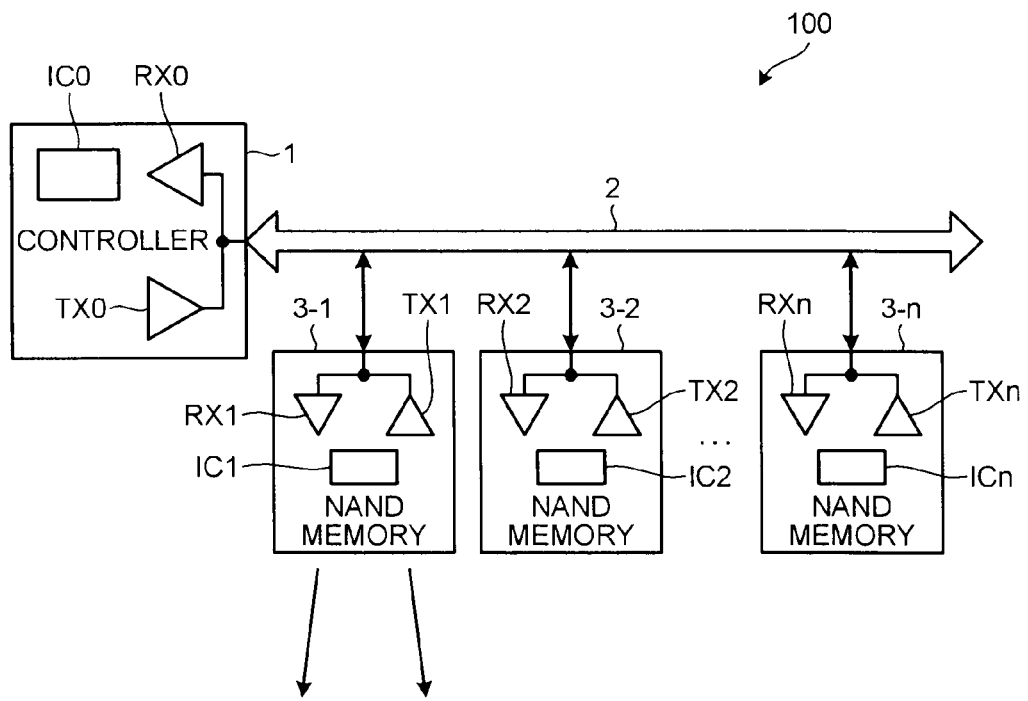
FIGS. 1A and 1B are views showing the configuration of a semiconductor storage device to which an input circuit according to an embodiment is applied.
Figure 1B:
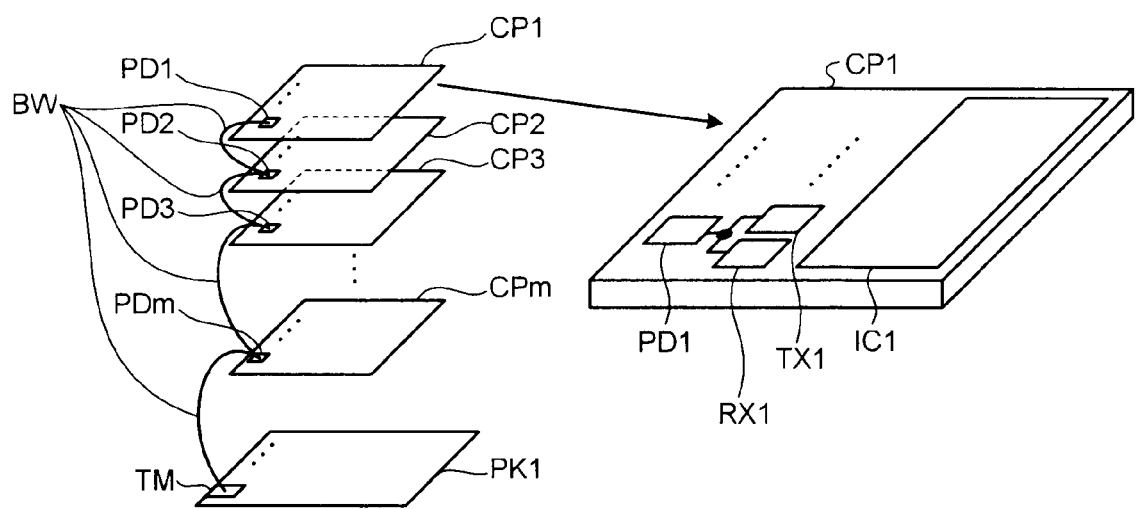
Figure 2:
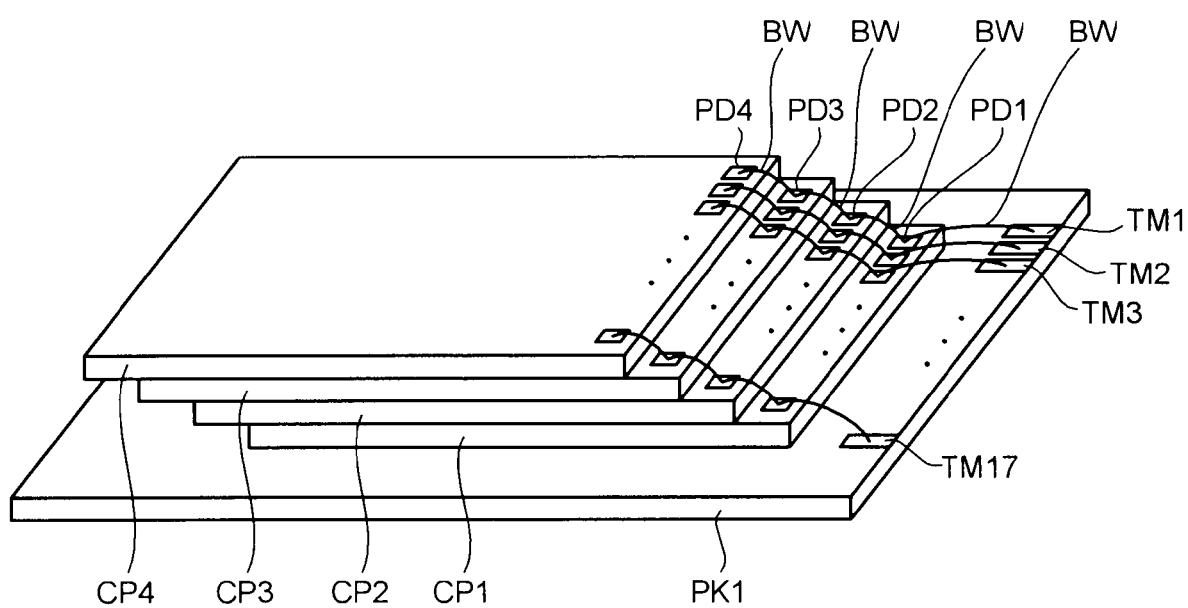
FIG. 2 is a view showing the configuration of the semiconductor storage device to which the input circuit according to the embodiment is applied.

A semiconductor storage device 100 to which an input circuit according to an embodiment is applied will be described with reference to FIGS. 1A, 1B, and 2. FIG. 1A is a block diagram showing an overall configuration of a semiconductor storage device to which an input circuit according to an embodiment is applied, and FIG. 1B is a diagram showing an internal configuration of a semiconductor storage element (for example, a NAND flash memory) of the semiconductor storage device. FIG. 2 is a perspective view showing a form mounting type NAND flash memory in the semiconductor storage device.

As shown in FIG. 1A, the semiconductor storage device 100 includes a controller 1 and n (n is an integer of 2 or more) semiconductor storage elements (for example, NAND flash memories 3-1 to 3-n). The semiconductor storage device 100 is used, for example, as a storage device such as a memory card or a solid-state disk (SSD).

The controller 1 controls to drive the NAND flash memories 3-1 to 3-n. In the following description, although the NAND flash memories 3-1 to 3-n are illustrated as examples of n semiconductor storage elements, the same can be applied to a case where the n semiconductor storage elements are other memory elements (for example, NOR flash memories). Moreover, examples of the control of driving the NAND flash memories 3-1 to 3-n include read/write control, block selection, error correction, wear leveling of the NAND flash memories 3-1 to 3-n.

A semiconductor chip (not shown) is formed on the controller 1, and pad electrodes are formed on the semiconductor chip. Moreover, an input circuit RX0 including an input buffer, an output circuit TX0 including an output buffer, and an internal circuit IC0 are mounted on the semiconductor chip.

The input circuit RX0 transfers readout data (input signal) transferred from the NAND flash memories 3-1 to 3-n to the internal circuit IC0 or the like while buffering such data using the input buffer. The output circuit TX0 transfers a control signal such as writing data or addresses supplied from the internal circuit IC0 to the NAND flash memories 3-1 to 3-n while buffering such data using the output buffer.

The NAND flash memories 3-1 to 3-n are connected in parallel to the controller 1 through a channel (bus) 2. For example, m (m is an integer of 2 or more) semiconductor chips CP1 to CPm are formed on the NAND flash memory 3-1, and pad electrodes PD1 to PDm are formed on the semiconductor chips CP1 to CPm, respectively. Moreover, for example, as shown in FIG. 1B, an input circuit RX1 including an input buffer, an output circuit TX1 including an output buffer, and a NAND flash memory circuit (internal circuit) IC1 are mounted on a semiconductor chip CP1. In addition, for example, a unit cell array, a decoder, a sense amplifier, a charge pump circuit, and a page buffer may be provided in the NAND flash memory circuit IC1.

The input circuit RX1 transfers a control signal (input signal) such as writing data (input signal) or addresses transferred from the controller 1 to the NAND flash memory circuit IC1 or the like while buffering such data using the input buffer. The output circuit TX1 transfers readout data read from the NAND flash memory circuit IC1 or the like to the controller 1 while buffering such data using the output buffer. The input circuit RX1, the output circuit TX1, and the NAND flash memory circuit IC1 are also mounted on each of the semiconductor chips CP2 to CPm. In FIG. 1A, a configuration in which such circuits are mounted on the respective semiconductor chips is illustrated as the internal configuration of the NAND flash memory 3-1.

The m semiconductor chips CP1 to CPm are mounted on a semiconductor package PK1, and an external terminal TM of the semiconductor package PK1 is shared by the pad electrodes PD1 to PDm of the m semiconductor chips CP1 to CPm.

When mounting the semiconductor chips CP1 to CPm on the semiconductor package PK1, the semiconductor chips CP1 to CPm may be staked on each other, and the semiconductor chips CP1 to CPm may be arranged on the same plane. Moreover, the semiconductor chips CP1 to CPm may be mounted in a face-up manner or a face-down manner. The single external terminal TM may be shared by the m pad electrodes PD1 to PDm by connecting the m pad electrodes PD1 to PDm and the single external terminal TM using bonding wires BW. Alternatively, the semiconductor chips CP1 to CPm may be mounted by flip-chip mounting so that the pad electrodes PD1 to PDm and the external terminal TM are connected to each other through bump electrodes that are formed on the pad electrodes PD1 to PDm. Alternatively, through holes may be formed in the semiconductor chips CP1 to CPm so that the pad electrodes PD1 to PDm and the external terminal TM are connected to each other through the through holes.

For example, in the NAND flash memory 3-1, the semiconductor chips CP1 to CP4 are mounted in a form as shown in FIG. 2. Pad electrodes PD1 to PD4 are formed on the semiconductor chips CP1 to CP4, respectively. The pad electrodes PD1 to PD4 can be used, for example, as address terminals, read/write terminals, chip-select terminals, or data terminals. Moreover, external terminals TM1 to TM17 are formed on the semiconductor package PK1. When four semiconductor chips CP1 to CP4 are mounted on the semiconductor package PK1 in a stacked manner, the semiconductor chips CP1 to CP4 can be stacked in a shifted manner so that the pad electrodes PD1 to PD4 are exposed. Moreover, the pad electrodes PD1 to PD4 are connected to the same external terminal TM1 through bonding wires BW, for example, whereby the single external terminal TM1 can be shared by the pad electrodes PD1 to PD4 of the four semiconductor chips CP1 to CP4.

Similarly to the NAND flash memory 3-1, as shown in FIG. 1A, input circuits RX2 to RXn, output circuits TX2 to TXn, and NAND flash memory circuits (internal circuits) IC2 to ICn are mounted on the respective semiconductor chips of the NAND flash memories 3-2 to 3-n.

As described above, the input circuit according to the embodiment is used as the input circuit RX0 to the internal circuit IC0 of the controller 1 and is used as the input circuits RX1 to RXn to the NAND flash memory circuits (internal circuits) IC1 to ICn of the NAND flash memories 3-1 to 3-n. In the following description, the input circuit RX0 and the input circuits RX1 to RXn will be collectively referred to as an input circuit RX, and the internal circuit IC0 and the NAND flash memory circuits (internal circuits) IC1 to ICn will be collectively referred to as an internal circuit IC.

Figure 3:
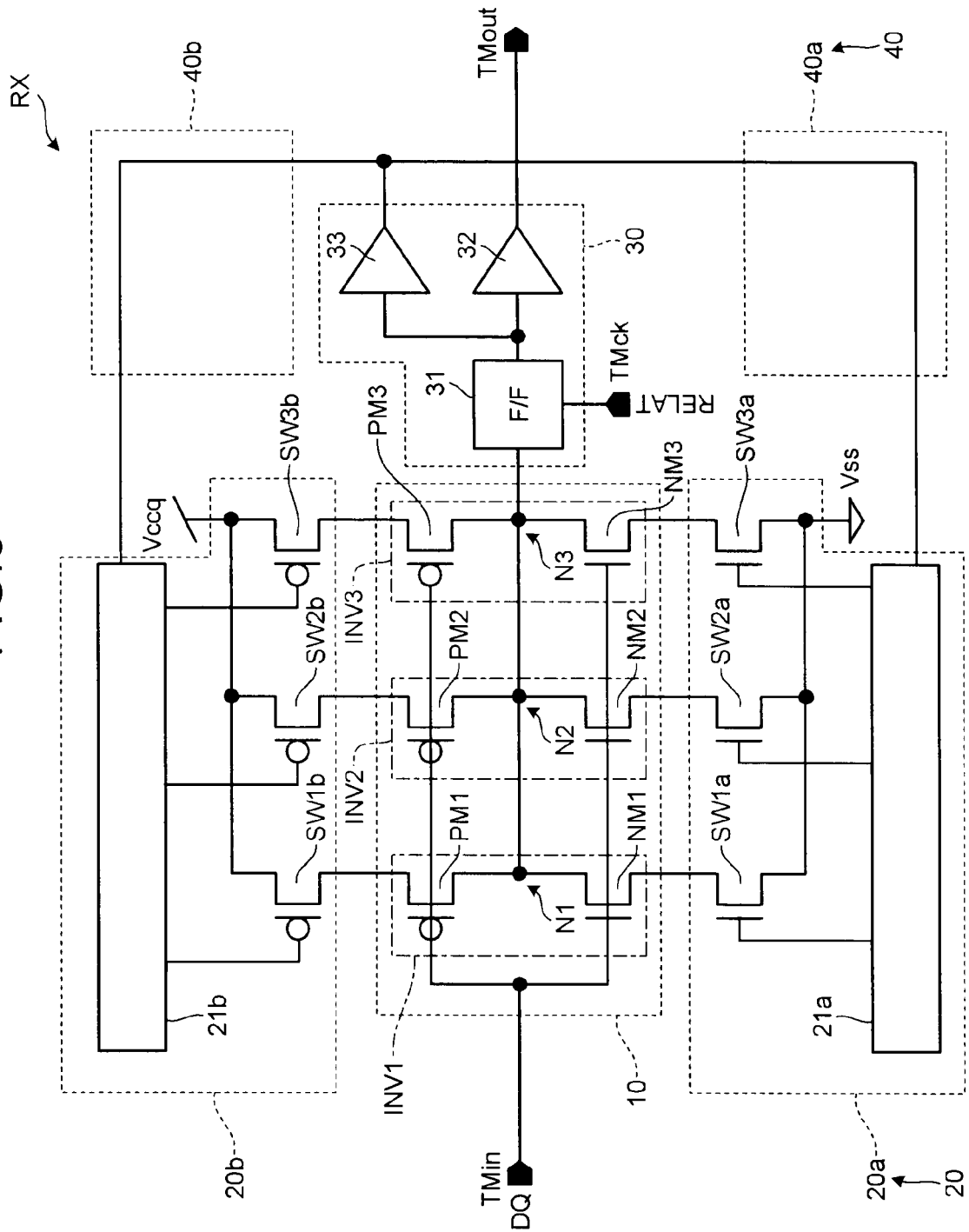
FIG. 3 is a view showing the configuration of the input circuit according to the embodiment.

Next, the configuration of the input circuit RX according to the embodiment will be described with reference to FIG. 3. FIG. 3 is a view showing the configuration of the input circuit RX.

The input circuit RX includes an input terminal TMin, an input buffer 10, a holding unit 30, an output terminal TMout, a feedback unit 40, and a control unit 20.

A signal is input to the input terminal TMin from the outside. For example, when the input circuit RX is the input circuit RX0 of the controller 1, signals are input to the input terminal TMin from the NAND flash memories 3-1 to 3-n. Alternatively, when the input circuit RX is one of the input circuits RX1 to RXn of the NAND flash memories 3-1 to 3-n, a signal is input to the input terminal TMin from the controller 1.

The input buffer 10 receives the signal input from the outside through the input terminal TMin. The input buffer 10 performs an operation of buffering the received signal and transfers the received signal to the holding unit 30. A plurality of CMOS inverters INV1 to INV3 are connected in parallel in the input buffer 10. That is, equivalently, the input nodes of the respective CMOS inverters INV1 to INV3 are connected to the input terminal TMin, and the output nodes N1 to N3 of the respective CMOS inverters INV1 to INV3 are connected to the holding unit 30. With this configuration, the plurality of CMOS inverters INV1 to INV3 receive the signal input from the outside.

The plurality of CMOS inverters INV1 to INV3 include a plurality of PMOS transistors PM1 to PM3 and a plurality of NMOS transistors NM1 to NM3, respectively. That is, in the respective CMOS inverters INV1 to INV3, the PMOS transistors PM1 to PM3 and the NMOS transistors NM1 to NM3 are connected so as to form an inverter circuit. For example, the respective PMOS transistors PM1 to PM3 have the gate electrodes thereof connected to the input terminal TMin, the source electrodes thereof connected to a power-supply voltage Vccq through the control unit 20, and the drain electrodes thereof connected to the output nodes N1 to N3. The respective NMOS transistors NM1 to NM3 have the gate electrodes thereof connected to the input terminal TMin, the source electrodes thereof connected to a reference voltage (for example, a ground voltage) Vss through the control unit 20, and the drain electrodes thereof connected to the output nodes N1 to N3.

The control unit 20 selects one or more PMOS transistors from the plurality of PMOS transistors PM1 to PM3 so as for the selected PMOS transistors to enter an operable state and selects one or more NMOS transistors from the plurality of NMOS transistors NM1 to NM3 so as for the selected NMOS transistors to enter an operable state. The control unit 20 adjusts the circuit threshold of the input buffer 10 so as to be identical to a reference value during initial setup. The reference value is set to Vccq/2 which is an intermediate value between the reference voltage Vss (for example, 0 V) and the power-supply voltage Vccq, for example. The operation of the control unit 20 after the initial setup will be described later.

Specifically, the control unit 20 includes control units 20a and 20b.

The control unit 20b includes a decoder 21b and a plurality of switches SW1b, SW2b, and SW3b. The decoder 21b receives and decodes a predetermined control signal to thereby generate control signals for turning on/off the respective switches SW1b to SW3b and supplies the controls signal to the control terminals (gate electrodes) of the respective switches SW1b to SW3b.

The respective switches SW1b to SW3b are disposed between the sources of the corresponding PMOS transistors PM1 to PM3 and the power-supply voltage Vccq, for example. The respective switches SW1b to SW3b are turned on when an ON-control signal is supplied to the control terminals thereof to thereby connect the sources of the corresponding PMOS transistors PM1 to PM3 and the power-supply voltage Vccq so that the corresponding PMOS transistors PM1 to PM3 enter an operable state. The respective switches SW1b to SW3b are turned off when an OFF-control signal is supplied to the control terminals thereof to thereby cut the electrical paths between the sources of the corresponding PMOS transistors PM1 to PM3 and the reference voltage Vss so that the corresponding PMOS transistors PM1 to PM3 enter a non-operable state.

Similarly, the control unit 20a includes a decoder 21a and a plurality of switches SW1a, SW2a, and SW3a. The decoder 21a receives and decodes a predetermined control signal to thereby generate control signals for turning on/off the respective switches SW1a to SW3a and supplies the control signals to the control terminals (gate electrodes) of the respective switches SW1a to SW3a.

The respective switches SW1a to SW3a are disposed between the sources of the corresponding NMOS transistors NM1 to NM3 and the reference voltage Vss, for example. The respective switches SW1a to SW3a are turned on when an ON-control signal is supplied to the control terminals thereof to thereby connect the sources of the corresponding NMOS transistors NM1 to NM3 and the reference voltage Vss so that the corresponding NMOS transistors NM1 to NM3 enter an operable state. The respective switches SW1a to SW3a are turned off when an OFF-control signal is supplied to the control terminals thereof to thereby cut the electrical paths between the sources of the corresponding NMOS transistors NM1 to NM3 and the reference voltage Vss so that the corresponding NMOS transistors NM1 to NM3 enter a non-operable state.

Figure 8A:
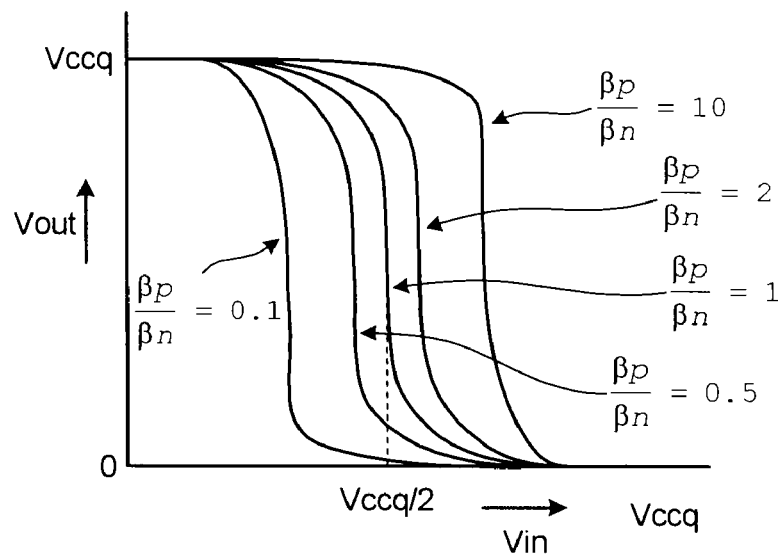
FIGS. 8A and 8B are views illustrating the operation of the input circuit according to the embodiment.
Figure 9A:
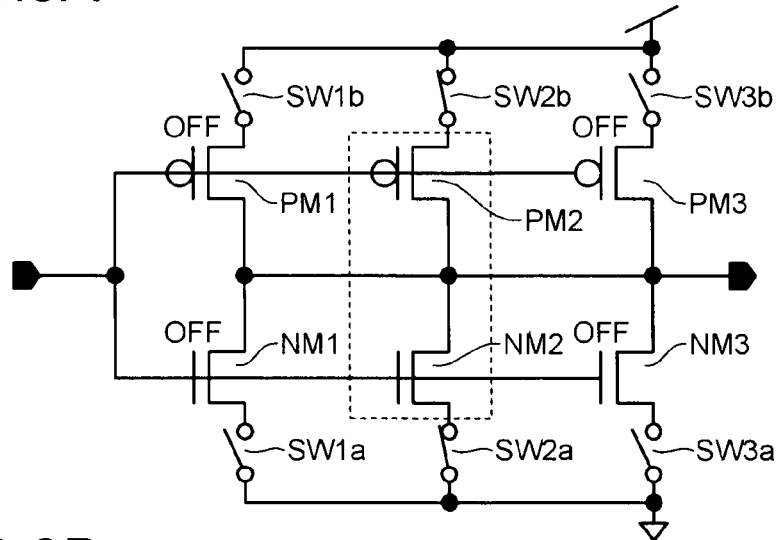
FIGS. 9A to 9C are views illustrating the operation of the input circuit according to the embodiment.

For example, when the plurality of PMOS transistors PM1 to PM3 have equal dimensions (=W/L, W: channel width and L: channel length) and equal properties (for example, carrier mobility and gate capacitance), and the plurality of NMOS transistors NM1 to NM3 have equal dimensions and equal properties, the control unit 20 can control the transistors as shown in FIG. 9A. That is, the control unit 20 turns on the switches SW2b and SW2a and turns off the switches SW1b, SW3b, SW1a, and SW3a so that the PMOS and NMOS transistors PM2 and NM2 enter an operable state and the PMOS and NMOS transistors PM1, PM3, NM1, and NM3 enter a non-operable state. In this way, the beta ratio ($\beta p/\beta n$) of the input buffer 10 becomes approximately identical to 1 (see FIG. 8A), and the circuit threshold of the input buffer 10 becomes approximately identical to a reference value (for example, Vccq/2). The beta ratio ($\beta p/\beta n$) is defined as a ratio calculated by dividing the sum ($\beta p$) of the gain factors of selected PMOS transistors by the sum ($\beta n$) of the gain factors of selected NMOS transistors.

The holding unit 30 shown in FIG. 3 holds the level of a signal transferred from the input buffer 10 in synchronization with a clock signal RELAT and outputs the held signal level to the output terminal TMout and the feedback unit 40. For example, the clock signal RELAT is an internal clock signal which is internally generated by the controller 1 (see FIG. 1A) (for example, from a read enable signal applied from outside the chip) and which is supplied from the controller 1 to a clock terminal TMck of the input circuit RX. Specifically, the holding unit 30 includes a flip-flop circuit 31 and amplifiers 32 and 33.

The data input terminal of the flip-flop circuit 31 is connected to the output nodes N1 to N3 of the respective CMOS inverters INV1 to INV3. The clock input terminal of the flip-flop circuit 31 is connected to the clock terminal TMck. The output terminal of the flip-flop circuit 31 is connected to the amplifiers 32 and 33. For example, the flip-flop circuit 31 latches (holds) the level of a signal transferred from the input buffer 10 through the output nodes N1 to N3 in synchronization with the rising (or falling) timing of the clock signal RELAT received to the clock input terminal. Moreover, the flip-flop circuit 31 outputs the latched (held) signal level to the amplifiers 32 and 33 from the output terminal. For example, when an H-level signal is latched at the rising (or falling) timing of the clock RELAT, the flip-flop circuit 31 output the H-level signal from the output terminal. For example, when an L-level signal is latched at the rising (or falling) timing of the clock RELAT, the flip-flop circuit 31 output the L-level signal from the output terminal.

The amplifier 32 amplifies the signal transferred from the flip-flop circuit 31 and outputs the level of the amplified signal to the output terminal TMout. The amplifier 33 amplifies the signal transferred from the flip-flop circuit 31 and outputs the level of the amplified signal to the feedback unit 40.

The signal output from the output terminal TMout is supplied to an internal circuit IC connected to the input circuit RX as subsequent stage. For example, when the input circuit RX is the input circuit RX0 of the controller 1, the internal circuit IC0 is as subsequent stage connected to the output terminal TMout. Alternatively, for example, when the input circuit RX is one of the input circuits RX1 to RXn of the NAND flash memories 3-1 to 3-n, one of the NAND flash memory circuits (internal circuits) IC1 to ICn is as subsequent stage connected to the output terminal TMout.

The feedback unit 40 feeds the level of the signal output from the holding unit 30 back to the control unit 20. The feedback unit 40 includes feedback lines 40a and 40b, for example. The feedback line 40a feeds the level of the signal output from the holding unit 30 back to the control unit 20a. The feedback line 40b feeds the level of the signal output from the holding unit 30 back to the control unit 20b.

After the initial setup, namely when performing an actual operation, the control unit 20 changes dynamically a PMOS transistor which is selected from the plurality of PMOS transistors PM1 to PM3 so as to enter the operable state and changes dynamically a NMOS transistor which is selected from the plurality of NMOS transistors NM1 to NM3 so as to enter the operable state in accordance with the level of the signal fed back by the feedback unit 40. That is, the control unit 20 changes dynamically a PMOS transistor which is selected from the plurality of PMOS transistors PM1 to PM3 so as to enter the operable state and changes dynamically a NMOS transistor which is selected from the plurality of NMOS transistors NM1 to NM3 so as to enter the operable state in accordance with the level of the signal transferred before one clock cycle of the clock signal RELAT.

Specifically, the control unit 20 controls the beta ratio ($\beta p/\beta n$) of the input buffer 10 so as to change the circuit threshold of the input buffer 10 in a direction where the circuit threshold of the input buffer 10 approaches the level of the signal fed back by the feedback unit 40. The beta ratio ($\beta p/\beta n$) is defined as a ratio calculated by dividing the sum ($\beta p$) of the gain factors of selected PMOS transistors by the sum ($\beta n$) of the gain factors of selected NMOS transistors.

More specifically, the control unit 20 increases the beta ratio ($\beta p/\beta n$) so that the circuit threshold of the input buffer 10 is greater than the reference value (for example, Vccq/2) when the level of the signal fed back by the feedback unit 40 is H level (see FIG. 8A). Here, the gain property of each PMOS transistor is substantially proportional to the dimension (=W/L, W: channel width and L: channel length) of the PMOS transistor, and the gain property of each NMOS transistor is substantially proportional to the dimension of the NMOS transistor. That is, when the level of the signal fed back by the feedback unit 40 is H level, the control unit 20 performs at least one of the following two operations. One is to increase the sum of the dimensions of PMOS transistors to be selected, and the other is to decrease the sum of the dimensions of NMOS transistors to be selected.

Figure 9B:
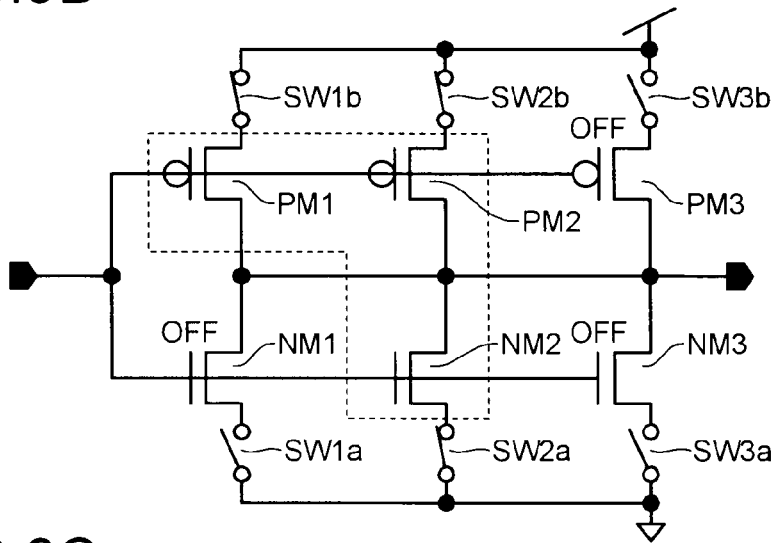

For example, when the plurality of PMOS transistors PM1 to PM3 have equivalent dimensions (=W/L, W: channel width and L: channel length) and equivalent properties (for example, carrier mobility and gate capacitance), and the plurality of NMOS transistors NM1 to NM3 have equivalent dimensions and equivalent properties, the control unit 20 can control the transistors as shown in FIG. 9B. That is, the control unit 20 turns on the switches SW1b, SW2b, and SW2a and turns off the switches SW3b, SW1a, and SW3a so that the PMOS and NMOS transistors PM1, PM2, and NM2 enter an operable state, and the PMOS and NMOS transistors PM3, NM1, and NM3 enter a non-operable state.

On the other hand, the control unit 20 decreases the beta ratio ($\beta p/\beta n$) so that the circuit threshold of the input buffer 10 is smaller than the reference value (for example, Vccq/2) when the level of the signal fed back by the feedback unit 40 is L level (see FIG. 8A). That is, when the level of the signal fed back by the feedback unit 40 is L level, the control unit 20 performs at least one of the following two operations. One is to decrease the sum of the dimensions of PMOS transistors to be selected, and the other is to increase the sum of the dimensions of NMOS transistors to be selected.

Figure 9C:
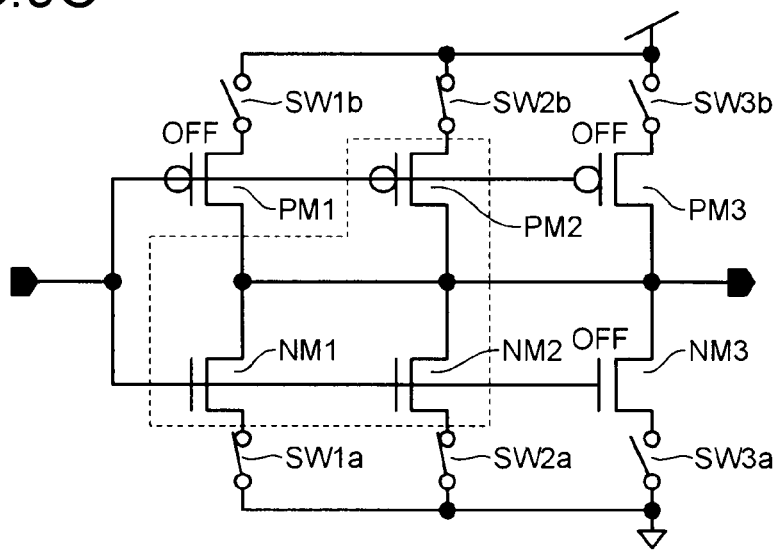

For example, when the plurality of PMOS transistors PM1 to PM3 have equivalent dimensions (=W/L, W: channel width and L: channel length) and equivalent properties (for example, carrier mobility and gate capacitance), and the plurality of NMOS transistors NM1 to NM3 have equivalent dimensions and equivalent properties, the control unit 20 can control the transistors as shown in FIG. 9C. That is, the control unit 20 turns on the switches SW2b, SW1a, and SW2a and turns off the switches SW1b, SW3b, and SW3a so that the PMOS and NMOS transistors PM2, NM1, and NM2 enter an operable state, and the PMOS and NMOS transistors PM1, PM3, and NM3 enter a non-operable state.

In the control unit 20, the decoders 21a and 21b may be integrated as a single decoder. In this case, in the feedback unit 40, the feedback lines 40a and 40b may be integrated as a single feedback line. In addition, the respective switches SW1b to SW3b may be disposed between the drains of the corresponding PMOS transistors PM1 to PM3 and the output nodes N1 to N3, for example. The respective switches SW1a to SW3a may be disposed between the drains of the corresponding NMOS transistors NM1 to NM3 and the output nodes N1 to N3, for example.

Figure 4:
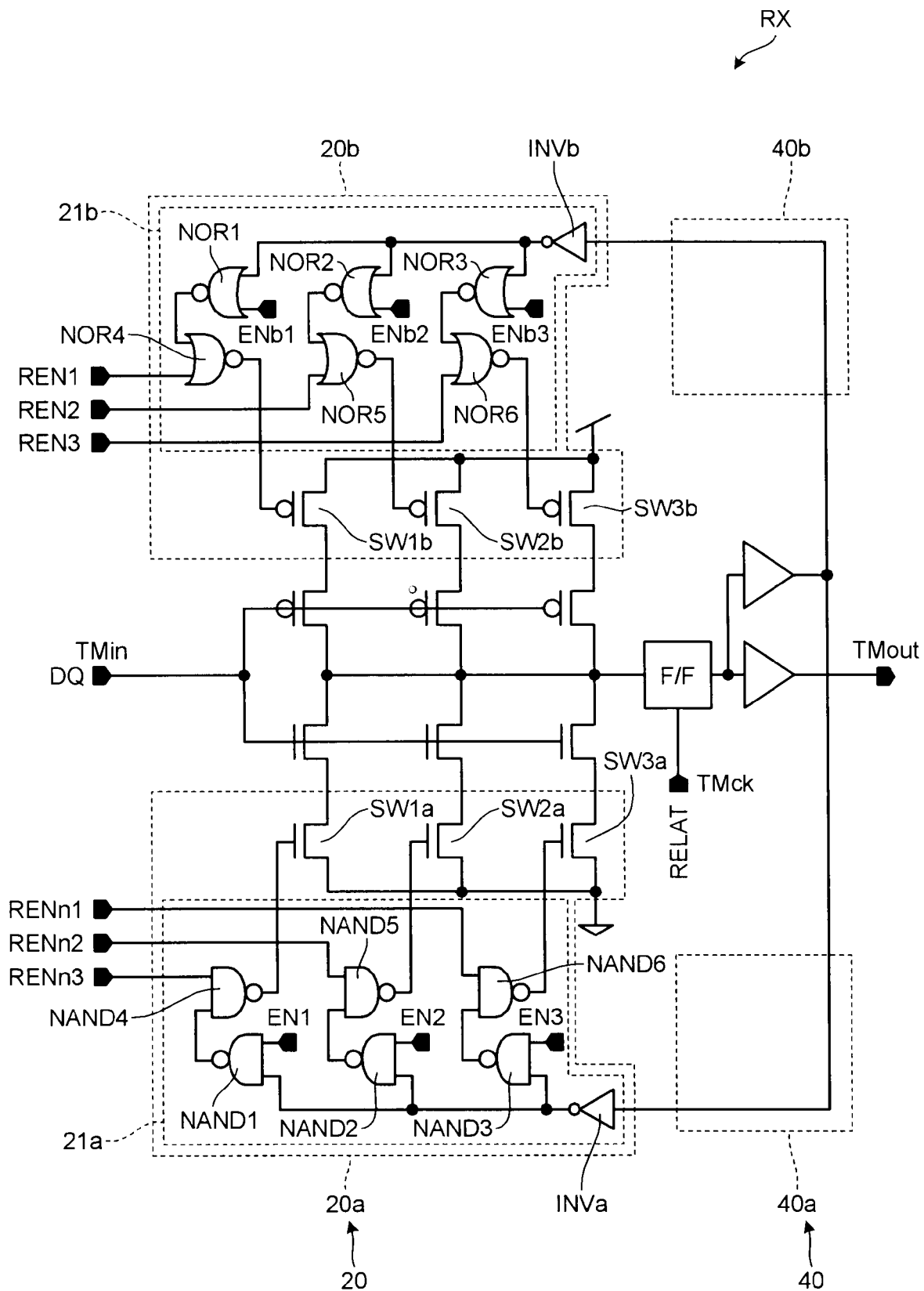
FIG. 4 is a view showing the configuration of the input circuit according to the embodiment.

Next, the internal configuration of the decoders 21a and 21b in the control unit 20 will be described with reference to FIG. 4. FIG. 4 is a circuit diagram showing an example of the internal configuration of the decoders 21a and 21b.

The decoder 21b includes an inverter INVb and a plurality of NOR gates NOR1 to NOR6 corresponding to the switches SW1b to SW3b in the control unit 20b. For example, NOR gates NOR1 and NOR4 correspond to the switch SW1b. The inverter INVb inverts the logical signal level fed back through the feedback line 40b of the feedback unit 40 and supplies the inverted signal level to the NOR gates NOR1 to NOR3. The NOR gates NOR1 to NOR3 execute a NOR operation on the signal supplied from the inverter INVb and control signals ENb1, ENb2, and ENb3, respectively, and supply the operation results to the corresponding NOR gates NOR4 to NOR6. The NOR gates NOR4 to NOR6 execute a NOR operation on the signals supplied from the NOR gates NOR1 to NOR3 and control signals REN1, REN2, and REN3, respectively, and supply the operation results to the control terminals (gate electrodes) of the switches SW1b to SW3b as ON/OFF control signals.

The control signals REN1, REN2, and REN3 are control signals for determining a dimension (W/L) which corresponds to the reference value (for example, Vccq/2) of the circuit threshold of the input buffer 10. The control signals ENb1, ENb2, and ENb3 are control signals for determining a dimension (W/L) which is to be changed in accordance with the level of the signal transferred before one clock cycle of the clock signal RELAT. For example, the control signals REN1, REN2, and REN3 and the control signals ENb1, ENb2, and ENb3 are control signals which are internally generated by the controller 1 (see FIG. 1A) based on data stored in the ROMFUSE (for example, in the corresponding NAND flash memory) and which are supplied from the controller 1 to the input circuit RX.

The decoder 21a includes an inverter INVa and a plurality of NAND gates NAND1 to NAND6 corresponding to the switches SW1a to SW3a in the control unit 20a. For example, NAND gates NAND1 and NAND4 correspond to the switch SW1a. The inverter INVa inverts the logical signal level fed back through the feedback line 40a of the feedback unit 40 and supplies the inverted signal level to the NAND gates NAND1 to NAND3. The NAND gates NAND1 to NAND3 execute a NAND operation on the signal supplied from the inverter INVa and control signals EN1, EN2, and EN3, respectively, and supply the operation results to the corresponding NAND gates NAND4 to NAND6. The NAND gates NAND4 to NAND6 execute a NAND operation on the signals supplied from the NAND gates NAND1 to NAND3 and control signals RENn1, RENn2, and RENn3, respectively, and supply the operation results to the control terminals (gate electrodes) of the switches SW1a to SW3a as ON/OFF control signals.

The control signals RENn1, RENn2, and RENn3 are control signals for determining a dimension (W/L) which corresponds to the reference value (for example, Vccq/2) of the circuit threshold of the input buffer 10. The control signals EN1, EN2, and EN3 are control signals for determining a dimension (W/L) which is to be changed in accordance with the level of the signal transferred before one clock cycle of the clock signal RELAT. For example, the control signals RENn1, RENn2, and RENn3 and the control signals EN1, EN2, and EN3 are control signals which are internally generated by the controller 1 (see FIG. 1A) based on data stored in the ROMFUSE (for example, in the corresponding NAND flash memory) and which are supplied from the controller 1 to the input circuit RX.

Next, the operation of the decoders 21a and 21b in the control unit 20 will be described with reference to FIG. 4.

For example, during the initial setup, all the control signals ENb1, ENb2, and ENb3 which are fixed to H level are supplied to the NOR gates NOR1 to NOR3. The NOR gates NOR1 to NOR3 supply L-level signals to the corresponding NOR gates NOR4 to NOR6, respectively, regardless of the level of the signal fed back through the feedback line 40b. In this case, the control signals RENT, REN2, and REN3 which, for example, have L, H, and L levels, respectively, are supplied to the NOR gates NOR4, NOR5, and NOR6, respectively. Then, the NOR gates NOR4, NOR5, and NOR6 supply signals having the H, L, and H levels, respectively, to the corresponding switches SW1b, SW2b, and SW3b, respectively.

Similarly, all the control signals EN1, EN2, and EN3 which are fixed to L level are supplied to the NAND gates NAND1 to NAND3. The NAND gates NAND1 to NAND3 supply H-level signals to the corresponding NAND gates NAND4 to NAND6, respectively, regardless of the level of the signal fed back through the feedback line 40a. In this case, the control signals RENn1, RENn2, and RENn3 which, for example, have H, L, and H levels, respectively, are supplied to the NAND gates NAND4, NAND5, and NAND6, respectively. Then, the NAND gates NAND4, NAND5, and NAND6 supply the respective signals having the L, H, and L levels to the corresponding switches SW1a, SW2a, and SW3a, respectively.

That is, the control unit 20 turns on the switches SW2b and SW2a and turns off the switches SW1b, SW3b, SW1a, and SW3a (see FIG. 9A) so that the PMOS and NMOS transistors PM2 and NM2 enter an operable state, and the PMOS and NMOS transistors PM1, PM3, NM1, and NM3 enter a non-operable state. As a result, for example, the beta ratio (βp/βn) of the input buffer 10 becomes approximately identical to 1 (see FIG. 8A), and the circuit threshold of the input buffer 10 becomes approximately identical to the reference value (for example, Vccq/2).

For example, during the actual operation after the initial setup, the control signals ENb1, ENb2, and ENb3 which have L, H, and H levels, respectively, are supplied to the NOR gates NOR1 to NOR3. The NOR gates NOR1 to NOR3 supply signals having the H, L, and L levels, respectively, to the corresponding NOR gates NOR4, NOR5, and NOR6, respectively, when the level of the signal fed back through the feedback line 40b is H level. In this case, similarly to during the initial setup, the control signals RENT, REN2, and REN3 which have L, H, and L levels, respectively, are supplied to the NOR gates NOR4, NOR5, and NOR6, respectively. Moreover, the NOR gates NOR4, NOR5, and NOR6 supply signals having the L, L, and H levels, respectively, to the corresponding switches SW1b, SW2b, and SW3b, respectively.

Similarly, the control signals EN1, EN2, and EN3 which have H, L, and L levels, respectively, are supplied to the NAND gates NAND1 to NAND3. The NAND gates NAND1 to NAND3 supply H-level signals to the corresponding NAND gates NAND4, NAND5, and NAND6 when the level of the signal fed back through the feedback line 40a is H level. In this case, similarly to during the initial setup, the control signals RENn1, RENn2, and RENn3 which have H, L, and H levels, respectively, are supplied to the NAND gates NAND4, NAND5, and NAND6, respectively. Moreover, the NAND gates NAND4, NAND5, and NAND6 supply signals having the L, H, and L levels, respectively, to the corresponding switches SW1a, SW2a, and SW3a, respectively.

In this way, during the actual operation, when the level of the signal fed back by the feedback unit 40 is H level, the control unit 20 turns on the switches SW1b, SW2b, and SW2a and turns off the switches SW3b, SW1a, and SW3a (see FIG. 9B) so that the PMOS and NMOS transistors PM1, PM2, and NM2 enter an operable state, and the PMOS and NMOS transistors PM3, NM1, and NM3 enter a non-operable state.

On the other hand, the NOR gates NOR1 to NOR3 supply L-level signals to the corresponding NOR gates NOR4, NOR5, and NOR6 when the level of the signal fed back through the feedback line 40b is L level. In this case, similarly to during the initial setup, the control signals REN1, REN2, and REN3 which have L, H, and L levels, respectively, are supplied to the NOR gates NOR4, NOR5, and NOR6, respectively. Moreover, the NOR gates NOR4, NOR5, and NOR6 supply signals having the H, L, H levels, respectively, to the corresponding switches SW1b, SW2b, and SW3b, respectively.

Similarly, the NAND gates NAND1 to NAND3 supply signals having the L, H, and H levels to the corresponding NAND gates NAND4, NAND5, and NAND6 when the level of the signal fed back through the feedback line 40a is L level. In this case, similarly to during the initial setup, the control signals RENn1, RENn2, and RENn3 which have H, L, and H levels, respectively, are supplied to the NAND gates NAND4, NAND5, and NAND6, respectively. Moreover, the NAND gates NAND4, NAND5, and NAND6 supply signals having the H, H, and L levels to the corresponding switches SW1a, SW2a, and SW3a, respectively.

In this way, during the actual operation, when the level of the signal fed back by the feedback unit 40 is L level, the control unit 20 turns on the switches SW2b, SW1b, and SW2a and turns off the switches SW1b, SW3b, and SW3a (see FIG. 9C) so that the PMOS and NMOS transistors PM2, NM1, and NM2 enter an operable state, and the PMOS and NMOS transistors PM1, PM3, and NM3 enter a non-operable state.

Figure 5:
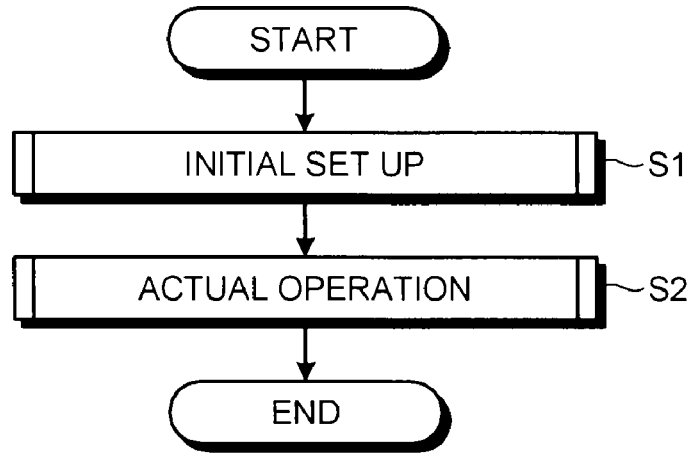
FIG. 5 is a flowchart showing the operation of the semiconductor storage device to which the input circuit according to the embodiment is applied.

Next, the operation of the input circuit RX according to the embodiment will be described with reference to FIG. 5. FIG. 5 is a flowchart showing the overall operation of the input circuit RX.

In Step S1, the input circuit RX performs initial setup. Specifically, the controller 1 supplies a test pattern to the input circuit RX. The control unit 20 of the input circuit RX adjusts the circuit threshold of the input buffer 10 so as to be approximately identical to the reference value using the test pattern supplied by the controller 1. The reference value is set to Vccq/2 which is an intermediate value between the reference voltage Vss (for example, 0 V) and the power-supply voltage Vccq, for example.

In Step S2, the input circuit RX performs an actual operation. Specifically, the control unit 20 of the input circuit RX controls the beta ratio (βp/βn) so that the circuit threshold of the input buffer 10 is changed from the reference value (for example, Vccq/2) adjusted in Step S1 to the level of a signal fed back by the feedback unit 40. The beta ratio (βp/βn) is defined as a ratio calculated by dividing the sum (βp) of the gain factors of selected PMOS transistors by the sum (βn) of the gain factors of selected NMOS transistors.

Figure 6:
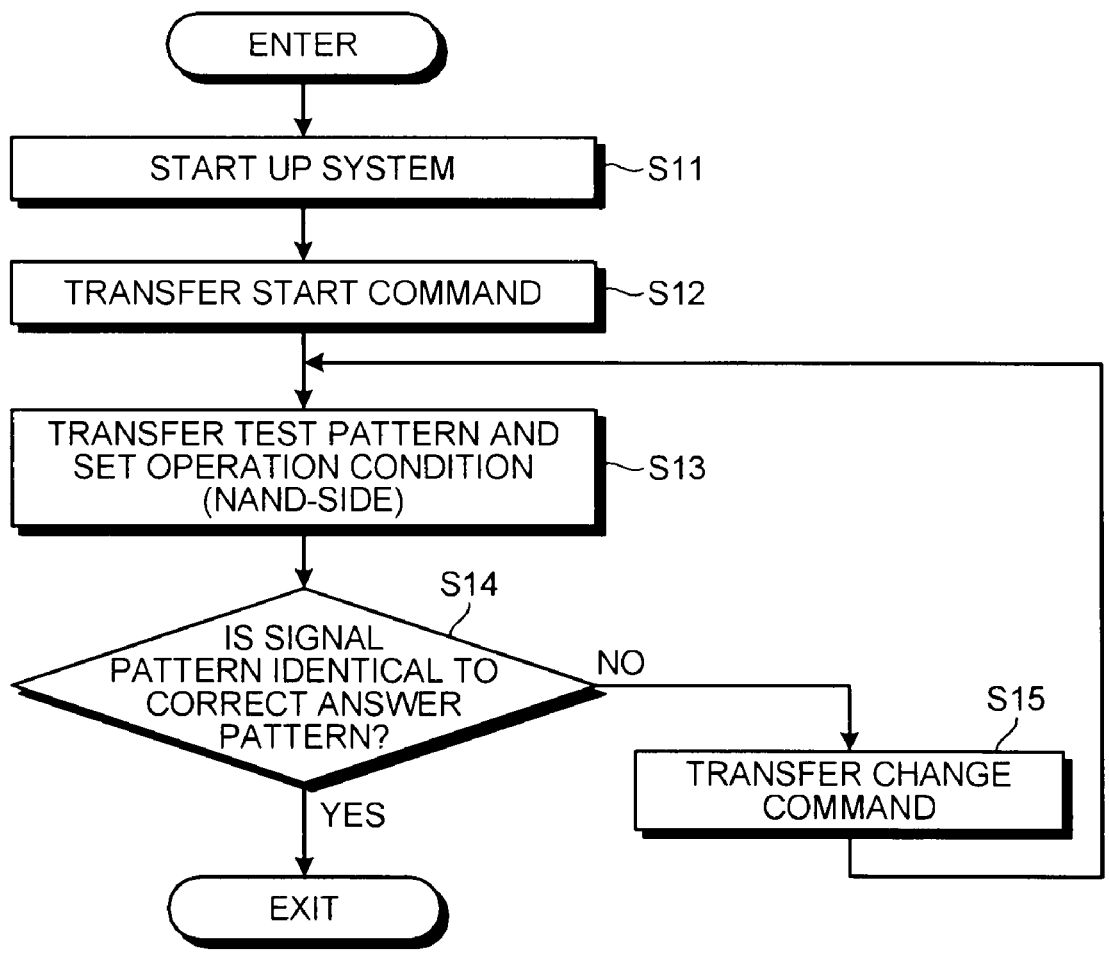
FIG. 6 is a flowchart showing the operation of the semiconductor storage device to which the input circuit according to the embodiment is applied.

Next, the details of the initial setup (Step S1 of FIG. 5) will be described with reference to FIG. 6. FIG. 6 is a flowchart showing the operation of the input circuit RX during the initial setup. In the following description, a case in which the input circuit RX is one of the input circuits RX1 to RXn of the NAND flash memories 3-1 to 3-$n$ will be described as an example. Moreover, the NAND flash memories 3-1 to 3-$n$ will be collectively referred to as a NAND flash memory 3.

In Step S11, the semiconductor storage device 100 is turned on, and a control system realized by the controller 1 is started. With this, in the controller 1, a system (an initial setup system) for performing initial setup on the input circuit RX in the NAND flash memory 3 is also started.

In Step S12, the controller 1 transfers a start command for notifying the start of a test operation on the NAND side to a comparator circuit (not shown) in the NAND flash memory 3 in accordance with the initial setup system. In this case, the controller 1 controls the data transfer rate of the start command when transferring the start command to the NAND flash memory 3 to a low rate (for example, 40 Mbps) sufficient for transferring the start command at an appropriate level. Upon receiving the start command, the comparator circuit reads and holds a correct answer pattern which is stored in advance in a ROM area in the internal circuit (the NAND flash memory circuit) IC.

In Step S13, the controller 1 generates a test pattern corresponding to the correct answer pattern. Moreover, the controller 1 selects one operation condition which has not yet been selected from a plurality of operation conditions of the input buffer 10, stored in the ROMFUSE in the NAND flash memory 3. The controller 1 generates control signals ENb1, ENb2, ENb3, REN1, REN2, REN3, EN1, EN2, EN3, RENn1, RENn2, and RENn3 in accordance with the selected operation condition. The controller 1 transfers the test pattern and the control signals ENb1 to RENb3 to the input circuit RX in the NAND flash memory 3. For example, the controller 1 transfers the test pattern to the input terminal TMin of the input circuit RX in the NAND flash memory 3 and transfers the control signals to the control terminals (see FIG. 4) of the decoders 21a and 21b in the input circuit RX. In this case, the controller 1 controls the data transfer rate of the test pattern when transferring to the NAND flash memory 3 so as to be a rate (for example, 400 Mbps) higher than that used in Step S12 in order to make the data transfer rate approximately identical to that used during the actual operation. Moreover, the control unit 20 of the input circuit RX sets the operation conditions of the plurality of PMOS transistors PM1 to PM3 and the plurality of NMOS transistors NM1 to NM3 in accordance with the received control signals ENb1 to ENb3, REN1 to REN3, EN1 to EN3, and RENn1 to RENn3. That is, the control unit 20 selects one or more PMOS transistors from the plurality of PMOS transistors PM1 to PM3 so as for the selected PMOS transistors to enter an operable state and selects one or more NMOS transistors from the plurality of NMOS transistors NM1 to NM3 so as for the selected NMOS transistors to enter an operable state. Moreover, in the input circuit RX, the input buffer 10 performs an operation of buffering the input test pattern, and the holding unit 30 holds the signal transferred from the input buffer 10 in synchronization with the clock signal RELAT and outputs the held signal to the output terminal TMout.

In Step S14, the comparator circuit in the NAND flash memory 3 compares the pattern (output signal pattern) of the signal output from the input circuit RX with the correct answer pattern held therein and holds the comparison result as a flag. The flag has a value indicating whether the two patterns are identical or not. The controller 1 reads the flag from the comparator circuit in the NAND flash memory 3. When the value of the flag indicates that the output signal pattern and the correct answer pattern are identical, the process ends. When the output signal pattern and the correct answer pattern are determined to be not identical, the process proceeds to Step S15.

In Step S15, the controller 1 transfers a change command for notifying that the operation condition is to be changed to the comparator circuit (not shown) in the NAND flash memory 3. In this case, the controller 1 controls the data transfer rate of the change command when transferring to the NAND flash memory 3 so as to be a low rate (for example, 40 Mbps) sufficient for transferring the change command at an appropriate level. Upon receiving the change command, the comparator circuit reads again and holds the correct answer pattern which is stored in advance in the ROM area in the internal circuit (the NAND flash memory circuit) IC.

The operations of Steps S13 to S15 are repeated until the output signal pattern is identical to the correct answer pattern. When the output signal pattern is determined to be identical to the correct answer pattern, the initial setup (Step S1 of FIG. 5) ends. In this way, the circuit threshold of the input buffer 10 of the input circuit RX is adjusted to be identical to the reference value (for example, Vccq/2).

Figure 7:
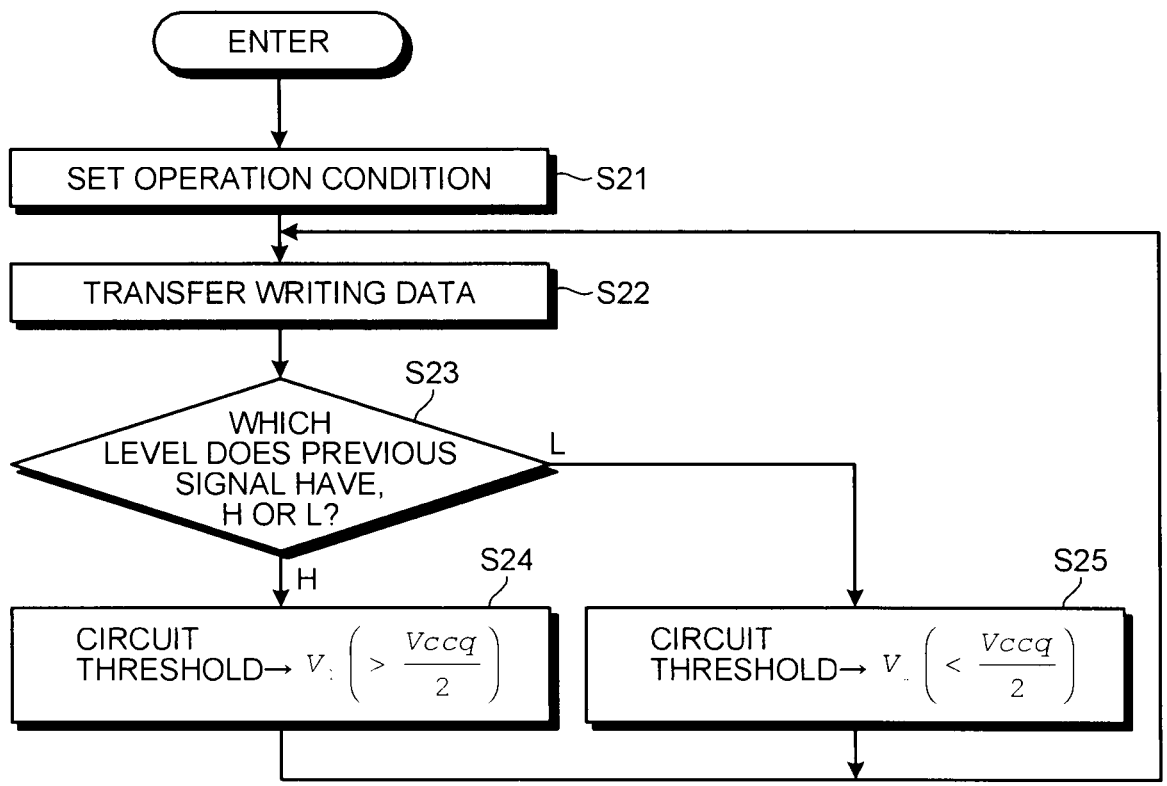
FIG. 7 is a flowchart showing the operation of the semiconductor storage device to which the input circuit according to the embodiment is applied.

Next, the details of the actual operation (Step S2 of FIG. 5) will be described with reference to FIG. 7. FIG. 7 is a flowchart showing the operation of the input circuit RX during the actual operation. In the following description, a case in which the input circuit RX is one of the input circuits RX1 to RXn of the NAND flash memories 3-1 to 3-$n$ will be described as an example. Moreover, the NAND flash memories 3-1 to 3-$n$ will be collectively referred to as a NAND flash memory 3.

In Step S21, the controller 1 changes the control signals ENb1 to ENb3 and EN1 to EN3 for determining the dimension (W/L) to be changed from the values for the initial setup (Step S1) to the values for the actual operation (Step S2) in accordance with the level of the previous signal (for example, the signal which is transferred before one clock cycle of the clock signal RELAT) and transfers the control signals having the changed values to the input circuit RX in the NAND flash memory 3.

For example, in the configuration shown in FIG. 4, during the initial setup (Step S1), all the control signals ENb1, ENb2, and ENb3 are fixed to H level, and all the control signals EN1, EN2, and EN3 are fixed to L level. In contrast, in Step S21, for example, the control signals ENb1, ENb2, and ENb3 are set to L, H, and H levels, respectively, and the control signals EN1, EN2, and EN3 are set to H, L, and L levels, respectively.

In Step S22, the controller 1 transfers data (writing data) to be written to the internal circuit (NAND flash memory circuit) IC in the NAND flash memory 3 to the input circuit RX in the NAND flash memory 3. In this case, the controller 1 controls the data transfer rate of the writing data when transferring the writing data to the NAND flash memory 3 so as to be approximately the same high rate (for example, 400 Mbps) as that used in Step S13.

Moreover, in the input circuit RX, the input buffer 10 performs an operation of buffering the input test pattern, and the holding unit 30 holds the signal transferred from the input buffer 10 in synchronization with the clock signal RELAT and outputs the held signal to the output terminal TMout and the feedback unit 40. The feedback unit 40 feeds the level of the signal output from the holding unit 30 back to the control unit 20.

In Step S23, the control unit 20 of the input circuit RX determines whether the level of the signal fed back by the feedback unit 40 is H level or L level. That is, it is determined whether the level of the previous signal (for example, the signal transferred before one clock cycle) is H level or L level. When the level of the previous signal is H level, the control unit 20 causes the process to proceed to Step S24. When the level of the previous signal is L level, the process proceeds to Step S25.

In Step S24, the control unit 20 of the input circuit RX increases the beta ratio ($\beta p/\beta n$) so that the circuit threshold of the input buffer 10 has a value V1 greater than the reference value (for example, Vccq/2) (see FIG. 8A). That is, the control unit 20 performs at least one of the following two operations. One is to increase the sum of the dimensions of PMOS transistors to be selected, and the other is to decrease the sum of the dimensions of NMOS transistors to be selected.

For example, the control unit 20 turns on the switches SW1b, SW2b, and SW2a and turns off the switches SW3b, SW1a, and SW3a (see FIG. 9B) so that the PMOS and NMOS transistors PM1, PM2, and NM2 enter an operable state, and the PMOS and NMOS transistors PM3, NM1, and NM3 enter a non-operable state.

In Step S25, the control unit 20 of the input circuit RX decreases the beta ratio ($\beta p/\beta n$) so that the circuit threshold of the input buffer 10 has a value V2 smaller than the reference value (for example, Vccq/2) (see FIG. 8A). That is, the control unit 20 performs at least one of the following two operations. One is to decrease the sum of the dimensions of PMOS transistors to be selected, and the other is to increase the sum of the dimensions of NMOS transistors to be selected.

For example, the control unit 20 turns on the switches SW2b, SW1a, and SW2a and turns off the switches SW1b, SW3b, and SW3a (see FIG. 9C) so that the PMOS and NMOS transistors PM2, NM1, and NM2 enter an operable state, and the PMOS and NMOS transistors PM1, PM3, and NM3 enter a non-operable state.

Here, as a comparative example, consider a case in which the input circuit RX is operated in a state where the circuit threshold of the input buffer 10 is approximately identical to the reference value (for example, Vccq/2) during the actual operation as well as the initial setup. In this case, as the operation speed required for the input buffer 10 increases, namely as the clock cycle period decreases, the effect of the junction capacitance at the output node where the drains of PMOS and NMOS transistors are connected may increase to a level so as not to be negligible. For example, since charging/discharging the junction capacitance takes time when communicating data at a high rate such as when the controller writes or reads data to/from a NAND flash memory at a high rate, it results in inter-symbol interference that a past signal level interferes with a present signal level. Thus, the signal level tends to deteriorate due to the inter-symbol interference. The above effect becomes more noticeable as the number of NAND flash memories (semiconductor chips) connected to the same channel (bus) increases.

For example, when the data transfer rate is 150 Mbps and writing data is "10000101111001010101110011001010010010," the waveform output from the input circuit RX changes as shown in FIGS. 16A to 16D as the junction capacitance Cj (see FIG. 16E) at the output node increases. That is, as the junction capacitance Cj at the output node is increased to 5 pF (FIG. 16A), 30 pF (FIG. 16B), 60 pF (FIG. 16C), and 90 pF (FIG. 16D), the present signal level tends to be attenuated by being attracted by the past signal level (for example, the level of the signal transferred before one clock cycle). As a result, since the slew rate at the first rising or falling timing of an operation waveform is slower than that at other timings, deterioration of signals due to inter-symbol interference becomes noticeable at the first rising or falling timing.

Figure 17B:
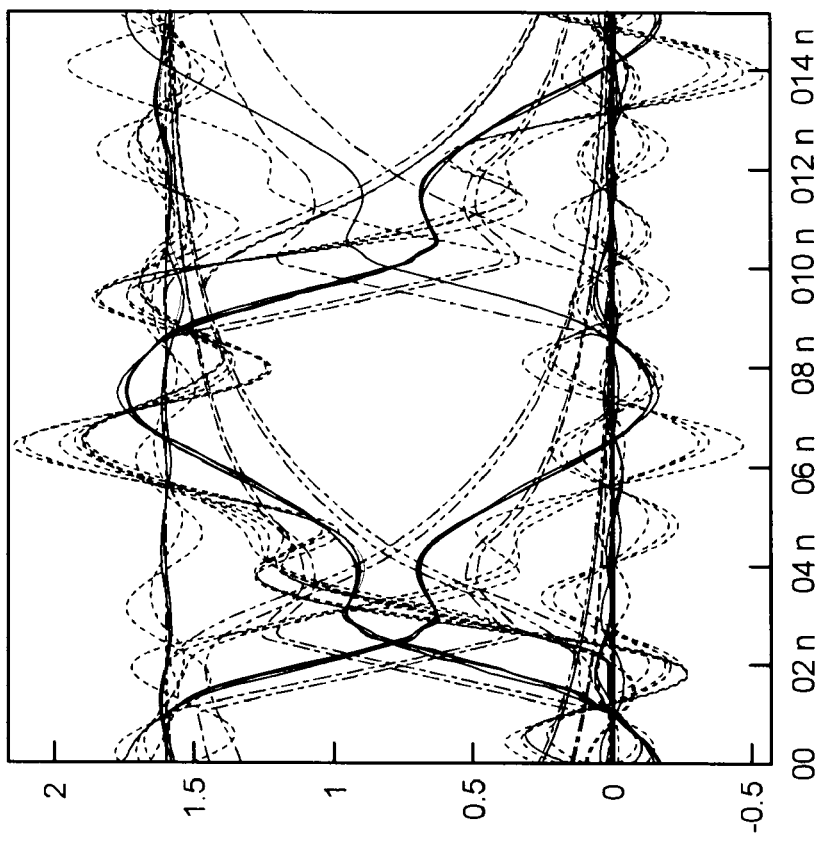
FIGS. 17A and 17B are views illustrating the operation of the input circuit according to the comparative example.
Figure 17A:
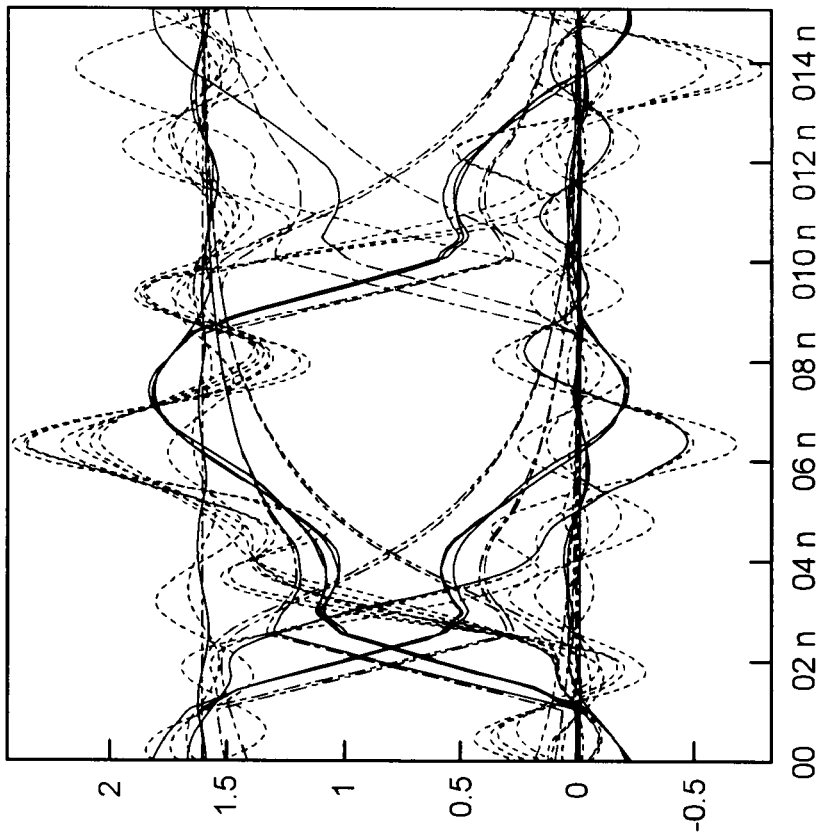

FIGS. 17A and 17B show the waveforms which are output from the input circuit RX and which are extracted in each clock cycle and superimposed on each other when the output resistance Rout is 18Ω and 25Ω, respectively, the data transfer rate is 133 Mbps, and the same data as above is written. That is, when transferring data from the NAND flash memory to the controller (waveforms depicted by solid and broken lines) and receiving data from the controller to the NAND flash memory (waveforms depicted by one-dot and two-dot chain lines), the slew rate is slow. The waveforms depicted by the solid line represent the case where a NAND flash memory closest to the controller transfers data to the controller, and the waveforms depicted by the broken line represent the case where a NAND flash memory farthest from the controller transfers data to the controller. The waveforms depicted by the one-dot chain line represent the case where the controller transfers data to a NAND flash memory closest to the controller, and the waveforms depicted by the two-dot chain line represent the case where the controller transfers data to a NAND flash memory farthest from the controller. Therefore, the timing margin (an operation margin in the time-axis direction) and the amplitude margin (an operation margin in the amplitude-axis direction) of the operation waveform may be narrowed. As a result, writing errors are likely to occur and this is likely to result in readout errors.

Figure 10:
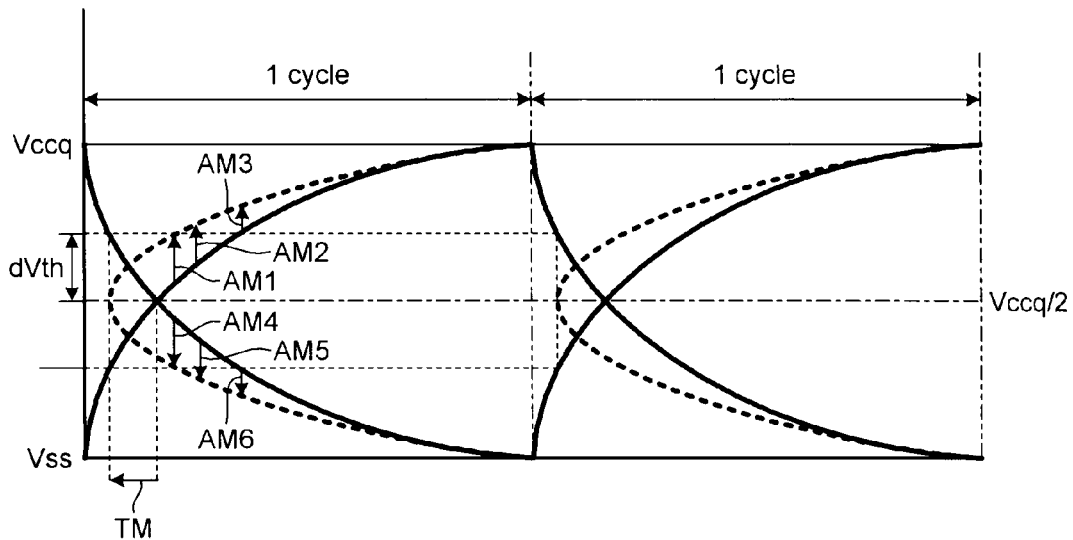
FIG. 10 is a view illustrating the operation of the input circuit according to the embodiment.

In contrast, in the embodiment, the control unit 20 controls the beta ratio ($\beta p/\beta n$) of the input buffer 10 so as to change the circuit threshold of the input buffer 10 in a direction where the circuit threshold of the input buffer 10 approaches the level of the signal fed back by the feedback unit 40. Specifically, the control unit 20 increases the beta ratio ($\beta p/\beta n$) so that the circuit threshold of the input buffer 10 is greater than the reference value (for example, Vccq/2) when the level of the signal fed back by the feedback unit 40 is H level (see FIG. 8A). On the other hand, the control unit 20 decreases the beta ratio ($\beta p/\beta n$) so that the circuit threshold of the input buffer 10 is smaller than the reference value (for example, Vccq/2) when the level of the signal fed back by the feedback unit 40 is L level (see FIG. 8A). In this way, as shown by the broken-line waveform in FIG. 10, it is possible to increase the slew rate virtually as compared to when the circuit threshold of the input buffer 10 has the reference value (the solid-line waveform). As a result, it is possible to reduce deterioration of signals due to inter-symbol interference and to secure a wide timing margin (see the arrow TM in FIG. 10) and a wide amplitude margin (see the arrows AM1 to AM6 in FIG. 10) of the operation waveform. Thus, it is possible to suppress writing errors, and eventually, to suppress readout errors. Moreover, it is possible to lessen the load of the output circuit and to decrease the size of the output buffer. Thus, it is possible to reduce current consumption.

In particular, when the level of the signal fed back by the feedback unit 40 is H level, the control unit 20 performs at least one of the following two operations. One is to increase the sum of the dimensions (W/L) of PMOS transistors to be selected, and the other is to decrease the sum of the dimensions (W/L) of NMOS transistors to be selected. For example, the control unit 20 increases the number of PMOS transistors which are caused to enter an operable state without changing the number of NMOS transistors which are caused to enter an operable state as compared to when the circuit threshold of the input buffer 10 is approximately identical to the reference value (see FIG. 9A). In this way, for example, since the sum of the dimensions (W/L) of PMOS transistors to be selected increases with no change in the sum of the dimensions (W/L) of NMOS transistors to be selected, the beta ratio (βp/βn) increases (greater than 1, for example). Thus, it is possible to control the circuit threshold of the input buffer 10 so as to be greater than the reference value (for example, Vccq/2) (see FIG. 8A).

On the other hand, when the level of the signal fed back by the feedback unit 40 is L level, the control unit 20 performs at least one of the following two operations. One is to decrease the sum of the dimensions of PMOS transistors to be selected, and the other is to increase the sum of the dimensions of NMOS transistors to be selected. For example, the control unit 20 increases the number of NMOS transistors which are caused to enter an operable state without changing the number of PMOS transistors which are caused to enter an operable state as compared to when the circuit threshold of the input buffer 10 is approximately identical to the reference value (see FIG. 9A). In this way, for example, since the sum of the dimensions (W/L) of NMOS transistors to be selected increases with no change in the sum of the dimensions (W/L) of PMOS transistors to be selected, the beta ratio (βp/βn) decreases (smaller than 1, for example). Thus, it is possible to control the circuit threshold of the input buffer 10 so as to be smaller than the reference value (for example, Vccq/2) (see FIG. 8A).

Figure 15:
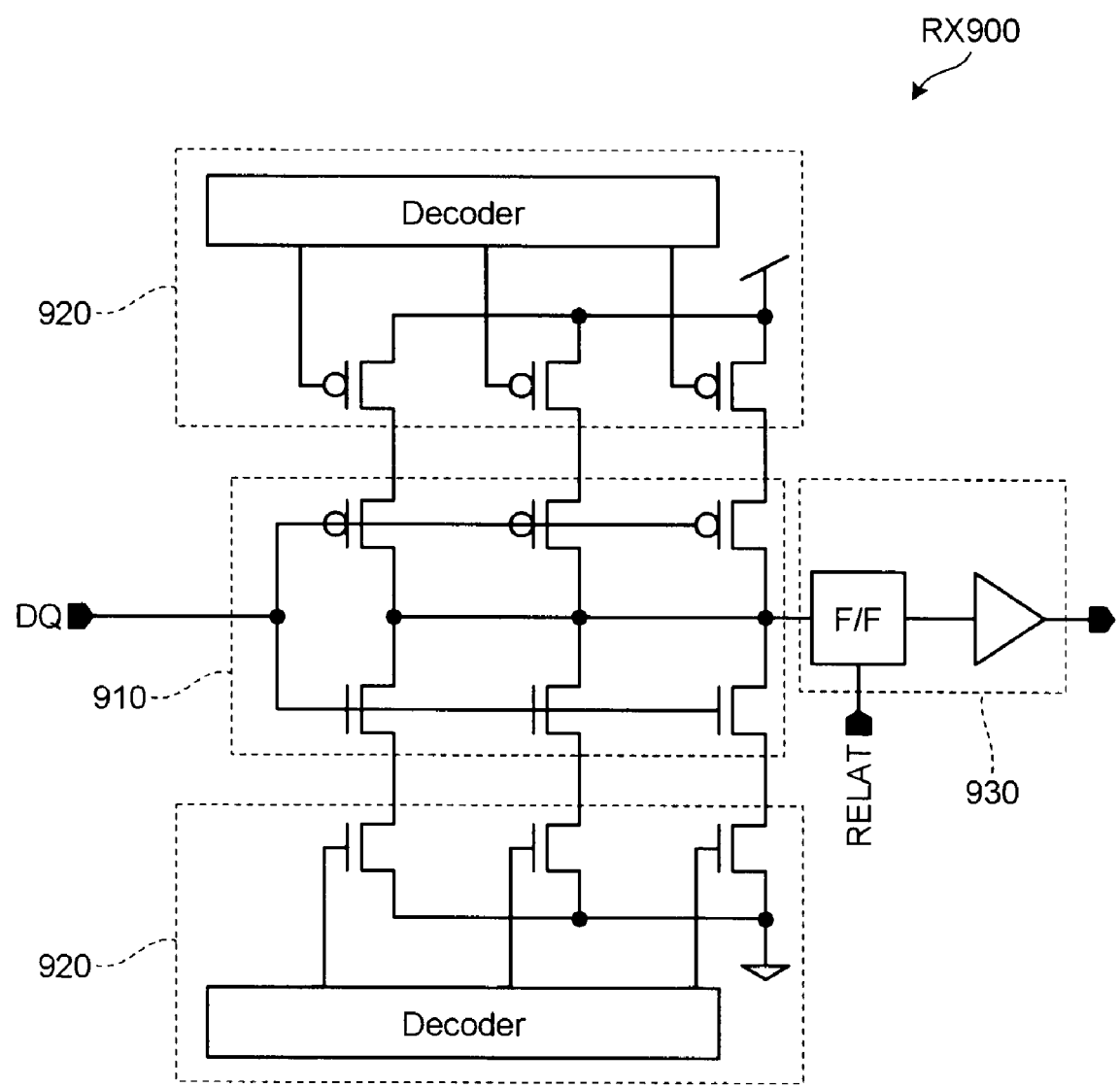
FIG. 15 is a view showing the configuration of an input circuit according to a comparative example.

Alternatively, as a comparative example, consider an input circuit RX900 as shown in FIG. 15 which does not have the feedback unit 40 (see FIG. 3). In the input circuit RX900, although a holding unit 930 holds a signal transferred from an input buffer 910 in synchronization with a clock signal and outputs the signal held therein, a control unit 920 is unable to grasp the level of the signal output from the holding unit 930. In this configuration, it is difficult to reduce deterioration of a signal level due to inter-symbol interference.

In contrast, in the input circuit RX of the embodiment, the holding unit 30 holds the signal transferred from the input buffer 10 in synchronization with a clock signal and outputs the signal held therein, and the feedback unit 40 feeds the signal output from the holding unit 30 back to the control unit 20. As described above, this configuration is suitable for allowing the control unit 20 to change the circuit threshold of the input buffer 10 in a direction where the circuit threshold of the input buffer 10 approaches the level of the signal fed back by the feedback unit 40. That is, according to the embodiment, it is possible to provide the input circuit RX which is suitable for reducing deterioration of the signal level due to inter-symbol interference.

It should be noted that the number of PMOS transistors and NMOS transistors which are changed depending on whether the level of the signal fed back by the feedback unit 40 is H or L level may be set to be the same or different for all of the input circuit RX0 of the controller 1 and the input circuits RX1 to RXn of the NAND flash memories 3-1 to 3-n. These setup data are stored in the ROMFUSE of the corresponding NAND flash memory. For example, when a plurality of NAND flash memories (semiconductor chips) is connected to the same channel (bus), the respective NAND flash memories (semiconductor chips) may have approximately the same setting values and may have different setting values.

Moreover, during the actual operation (Step S2 of FIG. 5) shown in FIG. 7, the controller 1 may transfer predetermined data for at least one clock cycle, before transferring writing data to the input circuit of the NAND flash memory during the actual operation. In this case, even when the properties of the respective transistors in the input buffer change with time during the time between the initial setup and the actual operation, it is possible to correctly set the operation condition so that the circuit threshold of the input buffer has the reference value (Vccq/2) and to change the circuit threshold of the input buffer from the reference value.

Moreover, the holding unit 30 shown in FIG. 3 may have k (k is an integer of 2 or more) flip-flop circuits which are connected in series between the output nodes N1 to N3 and the amplifiers 32 and 33 instead of the flip-flop circuit 31. In this case, the control unit 20 changes dynamically PMOS transistors which are selected from the plurality of PMOS transistors PM1 to PM3 so as to enter an operable state and changes dynamically NMOS transistors which are selected from the plurality of NMOS transistors NM1 to NM3 so as to enter an operable state in accordance with the level of a signal received before k clock cycles of the clock signal RELAT.

Furthermore, the feedback unit 40 may feed the output of n (2≦p≦k) flip-flop circuits among the output of the k series-connected flip-flop circuits back to the control unit 20 in parallel. In this case, the control unit 20 may change the dimensions of transistors based on the data stored in the ROMFUSE (for example, in the corresponding NAND flash memory), such that a changing amount of the dimensions in accordance with the level of a newer signal is greater than a changing amount of the dimensions in accordance with the level of an older signal. For example, when the feedback unit 40 feeds the output of the flip-flop circuits on the first and second stages back to the control unit 20, the control unit 20 receives the levels of the signals which are transferred before one and two clock cycles, respectively. In this case, the control unit 20 changes the dimensions of transistors such that a changing amount of the dimensions in accordance with the level of the signal transferred before one clock cycle is greater than a changing amount of the dimensions in accordance with the level of the signal received before two clock cycles. In this way, it is possible to change the dimensions so that the degree of the effect on the present signal level of the level of the signal transferred before one clock cycle is greater than that of the level of the signal received before two clock cycles. That is, it is possible to change the dimensions so that the level of a newer signal has a greater effect on the present signal level.

Figure 8B:
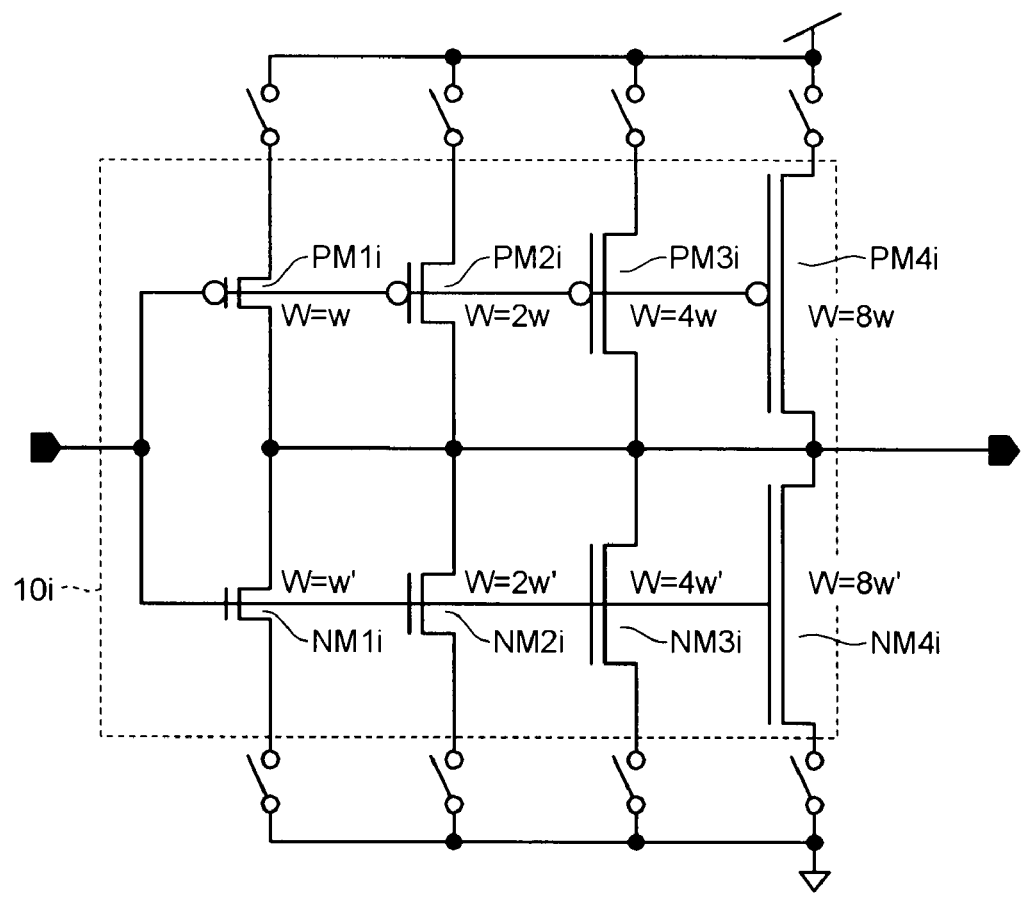

Moreover, in the input buffer, the plurality of PMOS transistors may have different dimensions (W/L), and the plurality of NMOS transistors may have different dimensions (W/L). For example, as shown in FIG. 8B, an input buffer 10$i$ may have a plurality of PMOS transistors PM1$i$, PM2$i$, PM3$i$, and PM4$i$ which have approximately the same channel lengths 1 but have different channel widths w, 2w, 4w, and 8w, respectively, and a plurality of NMOS transistors NM1$i$, NM2$i$, NM3$i$, and NM4$i$ which have approximately the same channel lengths l' but have different channel widths w', 2w', 4w', and 8w', respectively. In this case, the sum of the dimensions of PMOS transistors which are selected so as to enter an operable state among the plurality of PMOS transistors PM1$i$ to PM4$i$ may be changed in integer multiples (1×, 2×, 3×, 4×, 5×, and so on) (i.e. at a number of steps greater than the number of transistors) of w/l. Similarly, the sum of the dimensions of NMOS transistors which are selected so as to enter an operable state among the plurality of NMOS transistors NM1$i$ to NM4$i$ may be changed in integer multiples (1×, 2×, 3×, 4×, 5×, and so on) (i.e. at a number of steps greater than the number of transistors) of w'/l'.

Alternatively, for example, although not shown in the drawings, the input buffer may have a plurality of PMOS transistors which have approximately the same channel widths w but have different channel lengths 8*l*, 4*l*, 2*l*, and l, respectively, and a plurality of NMOS transistors which have approximately the same channel widths w but have different channel lengths 8*l'*, 4*l'*, 2*l'*, and l', respectively. In this case, the sum of the dimensions of PMOS transistors which are selected so as to enter an operable state among the plurality of PMOS transistors may be changed in integer multiples (1×, 2×, 3×, 4×, 5×, and so on) (i.e. at a number of steps greater than the number of transistors) of w/(8*l*). Similarly, the sum of the dimensions of NMOS transistors which are selected so as to enter an operable state among the plurality of NMOS transistors may be changed in integer multiples (1×, 2×, 3×, 4×, 5×, and so on) (i.e. at a number of steps greater than the number of transistors) of w'/(8*l'*).

Figure 11:
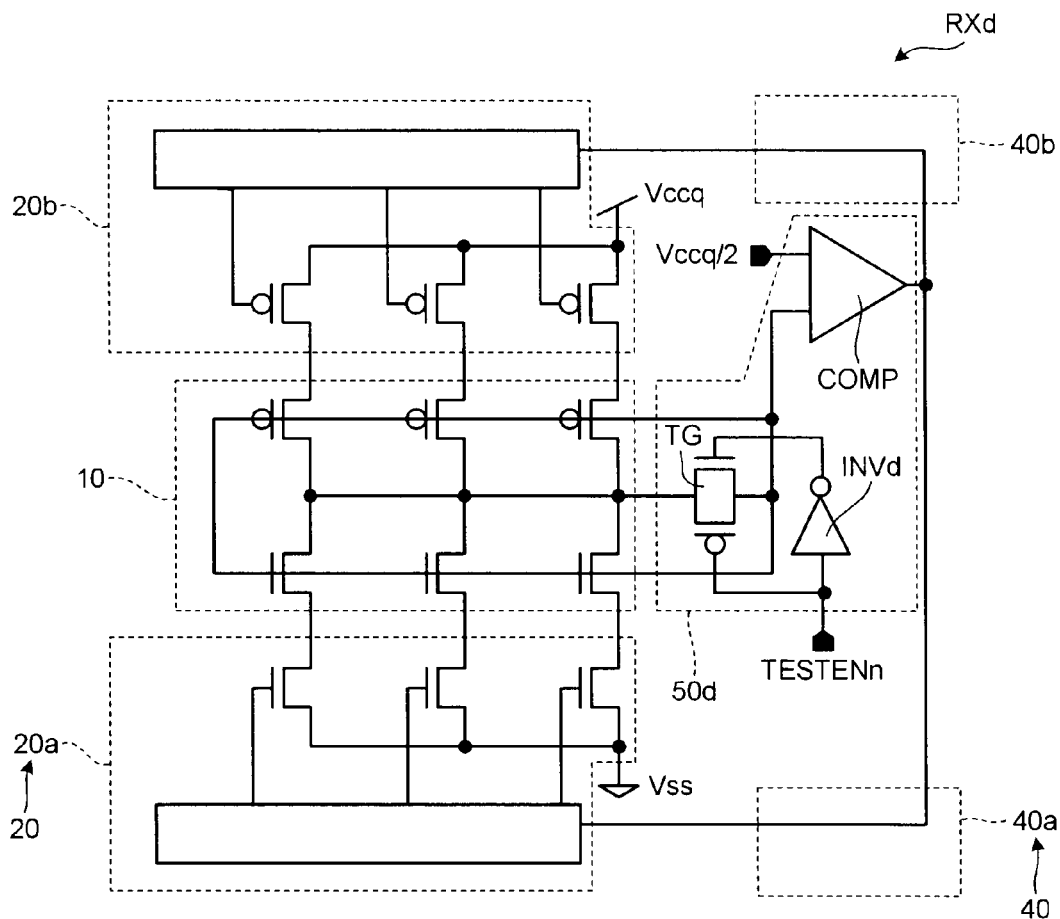
FIG. 11 is a view showing the configuration of an input circuit according to a modified example of the embodiment.

Furthermore, as shown in FIG. 11, the controller 1 and the NAND flash memories 3-1 to 3-*n* may further include a dummy input circuit RXd for automatically setting the circuit threshold of the input buffer 10 to the reference value (for example, Vccq/2) in addition to the input circuit RX. The dummy input circuit RXd is similar to the input circuit RX in that it includes the input buffer 10, the control unit 20, and the feedback unit 40 but is different from the input circuit RX in that it includes a setting unit 50*d*. The setting unit 50*d* receives a test enable signal (test pattern) TESTENn transferred from the controller 1. A transfer gate TG is turned on in response to the test enable signal TESTENn and the signal logically inverted by the inverter INVd and electrically shorts the output node and the input node of the input buffer 10. In this way, the circuit threshold of the input buffer 10 is supplied to a first input terminal of a comparator COMP. On the other hand, a signal representing Vccq/2 which is stored in advance in the internal circuit (NAND flash memory circuit) of the NAND flash memory is supplied to a second input terminal of the comparator COMP. A signal representing the comparison result output from the comparator COMP is fed back to the control unit 20 by the feedback unit 40. In this way, the control unit 20 can automatically set the circuit threshold of the input buffer 10 to the reference value (for example, Vccq/2) in accordance with the fed-back comparison result. Moreover, the dummy input circuit RXd can supply the control signals (RENT to REN3 and RENn1 to RENn3) used for setup to the control unit 20 of the input circuit RX. In this way, the input circuit RX can set the circuit threshold of the input buffer 10 to the reference value.

In this case, the setup of the operation condition of the input circuit is performed in a state where the driving capability of the output circuit in the controller or the NAND flash memory which outputs a predetermined data pattern is deteriorated by a predetermined amount from the normal driving capability (i.e. with a strict condition). With this operation, since the output circuit operates with a more moderate condition during the actual operation, it is possible to operate the output circuit in a stable state.

Figure 12:
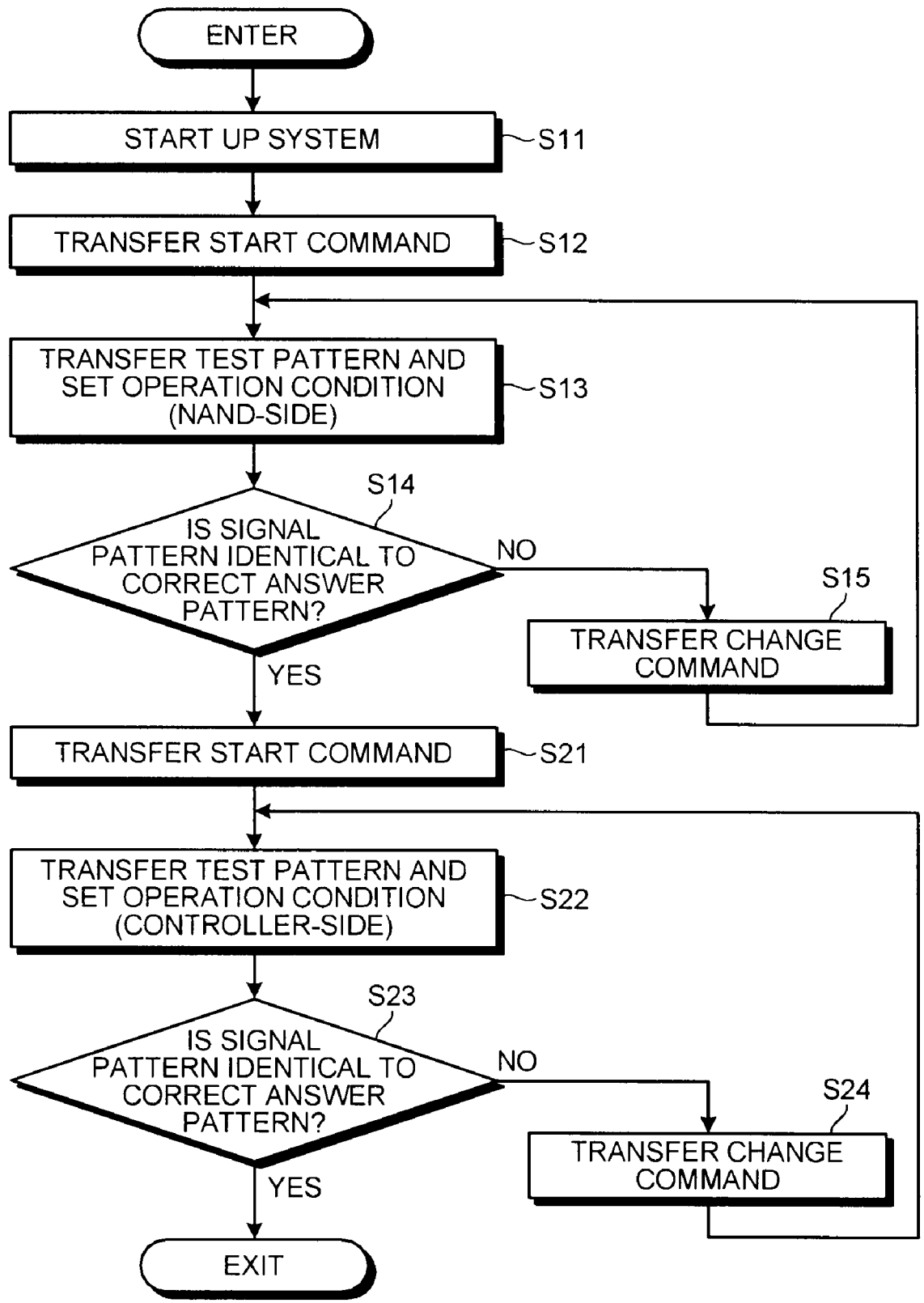
FIG. 12 is a flowchart showing the operation of a semiconductor storage device according to another modified example of the embodiment.

Furthermore, in the initial setup (Step S1 of FIG. 5), a test operation of the input circuit on the controller side may be performed in addition to the test operation of the input circuit on the NAND side. That is, the operation shown in FIG. 12 may be performed instead of the operation shown in FIG. 6. The operation shown in FIG. 12 is different from the operation shown in FIG. 6 in the following respects.

In Step S14, the controller 1 causes the process to proceed to Step S21 when the output signal pattern is determined to be identical to the correct answer pattern.

In Step S21, the controller 1 transfers a start command for notifying the start of a test operation on the controller side to a test circuit (not shown) in the NAND flash memory 3 in accordance with the initial setup system. In this case, the controller 1 controls the data transfer rate of the start command when transferring to the NAND flash memory 3 to a low rate (for example, 40 Mbps) sufficient for transferring the start command at an appropriate level. Moreover, the comparator circuit (not show) in the controller 1 reads and holds a correct answer pattern which is stored in advance in a ROM area in the internal circuit IC.

In Step S22, upon receiving the start command (or a change command), the test circuit in the NAND flash memory 3 reads the test pattern which is stored in advance in the ROM area in the internal circuit (NAND flash memory circuit) IC as the test pattern corresponding to the correct answer pattern. Moreover, the test circuit in the NAND flash memory 3 selects one operation condition which has not yet been selected from a plurality of operation conditions of the input buffer 10, stored in the ROMFUSE in the NAND flash memory 3. The test circuit in the NAND flash memory 3 generates control signals ENb1, ENb2, ENb3, REN1, REN2, REN3, EN1, EN2, EN3, RENn1, RENn2, and RENn3 in accordance with the selected operation condition. The test circuit in the NAND flash memory 3 transfers the test pattern and the control signals ENb1 to RENb3 to the input circuit RX in the controller 1. For example, the test circuit of the NAND flash memory 3 transfers the test pattern to the input terminal TMin of the input circuit RX in the controller 1 and transfers the control signals to the control terminals (see FIG. 4) of the decoders 21*a* and 21*b* in the input circuit RX. In this case, the test circuit of the NAND flash memory 3 controls the data transfer rate of the test pattern when transferring to the controller 1 to a higher rate (for example, 400 Mbps) than that used in Step S21 in order to make the data transfer rate identical to that used during the actual operation.

Moreover, the control unit 20 of the input circuit RX sets the operation conditions of the plurality of PMOS transistors PM1 to PM3 and the plurality of NMOS transistors NM1 to NM3 in accordance with the received control signals ENb1, ENb2, and ENb3. That is, the control unit 20 selects one or more PMOS transistors from the plurality of PMOS transistors PM1 to PM3 so as to enter an operable state and selects one or more NMOS transistors from the plurality of NMOS transistors NM1 to NM3 so as to enter an operable state. Moreover, in the input circuit RX, the input buffer 10 performs an operation of buffering the input test pattern, and the holding unit 30 holds the signal transferred from the input buffer 10 in synchronization with the clock signal RELAT and outputs the held signal to the output terminal TMout.

In Step S23, the comparator circuit in the controller 1 compares the pattern (output signal pattern) of the signal output from the input circuit RX with the correct answer pattern held therein and holds the comparison result as a flag. The flag has a value indicating whether the two patterns are identical or not. When the controller 1 determines that the value of the flag indicates that the output signal pattern and the correct answer pattern are identical, the process ends. When the output signal pattern and the correct answer pattern are determined to be not identical, the process proceeds to Step S24.

In Step S24, the controller 1 transfers a change command for notifying that the operation condition is to be changed to the test circuit (not shown) in the NAND flash memory 3. In this case, the controller 1 controls the data transfer rate of the change command when transferring to the NAND flash memory 3 to a low rate (for example, 40 Mbps) sufficient for transferring the change command at an appropriate level. When the test circuit receives the change command, the process proceeds to Step S22.

The operations of Steps S22 to S24 are repeated until the output signal pattern is identical to the correct answer pattern. When the output signal pattern is determined to be identical to the correct answer pattern, the initial setup (Step S1 of FIG. 5) ends. In this way, the circuit threshold of the input buffer 10 of the input circuit RX on the controller 1 side in addition to the input circuit RX on the NAND side is adjusted to be identical to the reference value (for example, Vccq/2).

Figure 13:
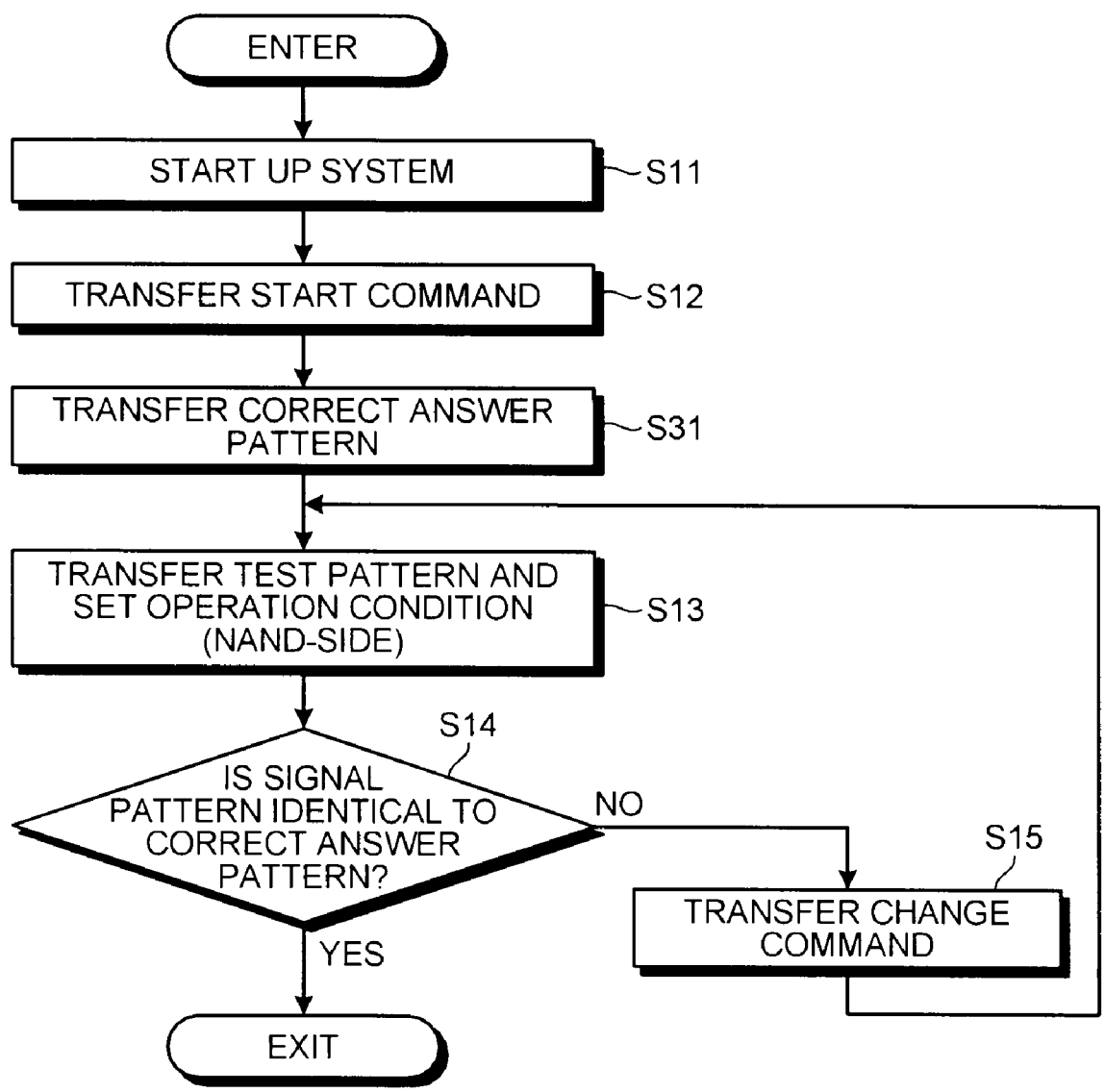
FIG. 13 is a flowchart showing the operation of a semiconductor storage device according to another modified example of the embodiment.

Alternatively, during the initial setup (Step S1 of FIG. 5), the correct answer pattern may be transferred from the controller 1 to the NAND flash memory 3 during the test operation of the input circuit on the NAND side. That is, the operation shown in FIG. 13 may be performed instead of the operation shown in FIG. 6. The operation shown in FIG. 13 is different from the operation shown in FIG. 6 in the following respects.

In Step S12, upon receiving the start command, the comparator circuit in the NAND flash memory 3 enters a standby mode where it waits for the transfer of the correct answer pattern.

The operation of Step S31 is performed between Step S12 and Step S13. In Step S31, the controller 1 reads the correct answer pattern which is stored in advance in the ROM area in the internal circuit IC. The controller 1 transfers the correct answer pattern to the comparator circuit in the NAND flash memory 3. In this case, the controller 1 controls the data transfer rate of the start command when transferring to the NAND flash memory 3 to a low rate (for example, 40 Mbps) sufficient for transferring the start command at an appropriate level. The comparator circuit in the NAND flash memory 3 holds the received correct answer pattern.

As described above, since the correct answer pattern is transferred from the controller 1 to the NAND flash memory 3, it is not necessary to store the correct answer pattern in the ROM area in the internal circuit (NAND flash memory circuit) IC of the NAND flash memory 3. In this way, it is possible to suppress the ROM area of the NAND flash memory 3 from being consumed by the correct answer pattern.

Figure 14:
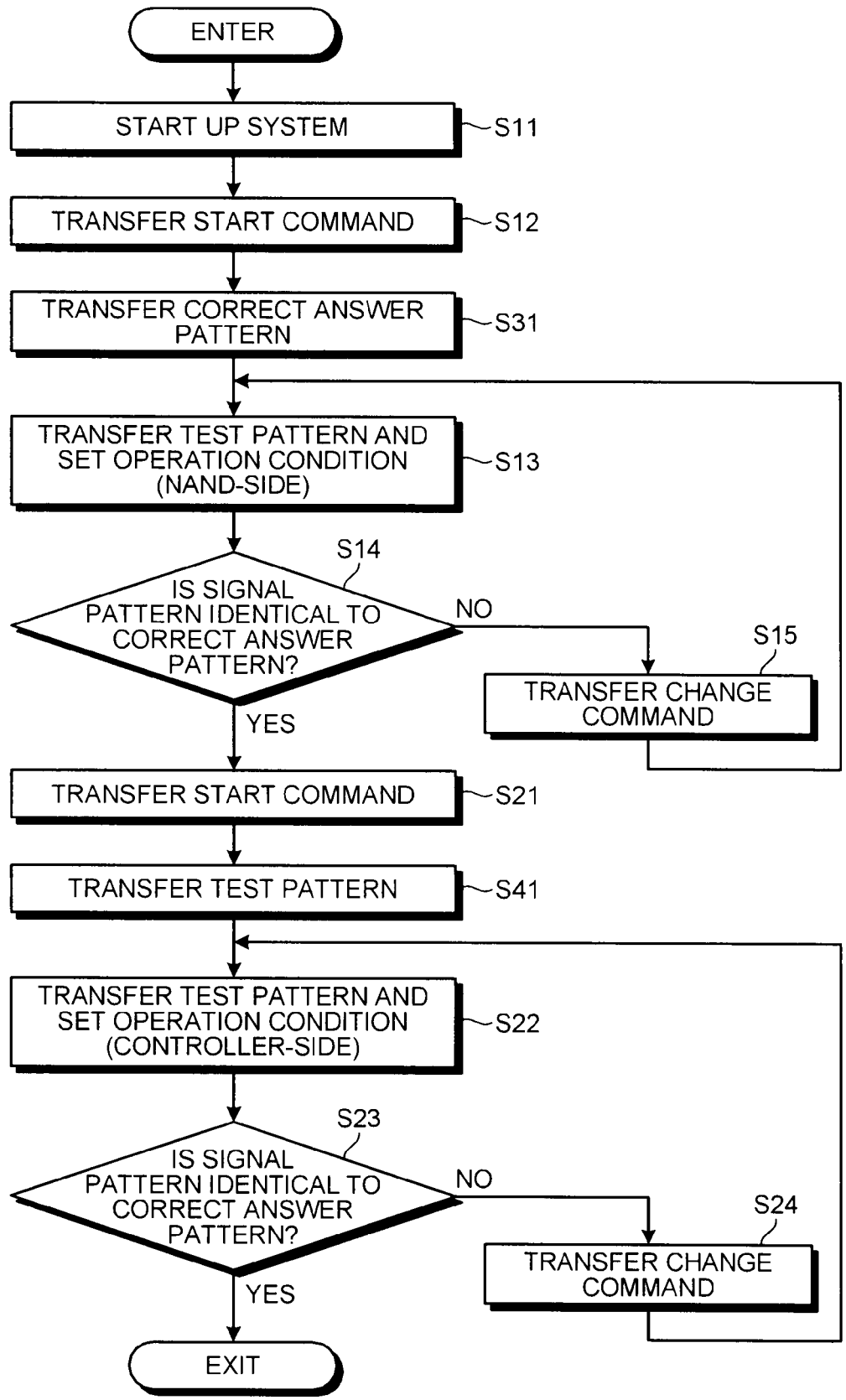
FIG. 14 is a flowchart showing the operation of a semiconductor storage device according to another modified example of the embodiment.

Alternatively, during the initial setup (Step S1 of FIG. 5), the operation of transferring the correct answer pattern may be performed during the test operation of the input circuit on the controller side in addition to the test operation of the input circuit on the NAND side. That is, the operation shown in FIG. 14 may be performed instead of the operations shown in FIGS. 12 and 13. The operation shown in FIG. 14 is different from the operations shown in FIGS. 12 and 13 in the following respects.

The operation of Step S41 is performed between Step S21 and Step S22. In Step S41, the controller 1 generates the test pattern corresponding to the correct answer pattern. The controller 1 transfers the test pattern to the test circuit in the NAND flash memory 3. In this case, the controller 1 controls the data transfer rate of the test pattern when transferring to the test circuit in the NAND flash memory 3 to a low rate (for example, 40 Mbps) sufficient for transferring the test pattern at an appropriate level. The test circuit in the NAND flash memory 3 holds the received test pattern.

As described above, since the test pattern is transferred from the controller 1 to the NAND flash memory 3, it is not necessary to store the test pattern in the ROM area in the internal circuit (NAND flash memory circuit) IC of the NAND flash memory 3. In this way, it is possible to suppress the ROM area of the NAND flash memory 3 from being consumed by the test pattern as well as the correct answer pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An input circuit comprising:
   an input buffer that receives a signal input from an outside and that includes a plurality of CMOS inverters connected in parallel to each other, the plurality of CMOS inverters including a plurality of PMOS transistors and a plurality of NMOS transistors;
   a control unit that selects one or more PMOS transistors from the plurality of PMOS transistors so as to enter an operable state and selects one or more NMOS transistors from the plurality of NMOS transistors so as to enter an operable state;
   a holding unit that holds a level of a signal transferred from the input buffer in synchronization with a clock signal and outputs the held signal level; and
   a feedback unit that feeds the level of the signal output from the holding unit back to the control unit.

2. The input circuit according to claim 1,
   wherein the holding unit holds the level of the signal transferred from the input buffer at one clock cycle of the clock signal and outputs the level of the transferred signal before one clock cycle,
   wherein the feedback unit feeds the level of the transferred signal before one clock cycle output by the holding unit back to the control unit, and
   wherein the control unit changes dynamically the selected one or more PMOS transistors and the selected one or more NMOS transistors in accordance with the fed-back level of the transferred signal before one clock cycle.

3. The input circuit according to claim 1,
   wherein the control unit controls a ratio which is calculated by dividing a sum of gain factors of the one or more PMOS transistors by a sum of gain factors of the one or more NMOS transistors such that a circuit threshold of the input buffer approaches the level of the transferred signal fed back by the feedback unit.

4. The input circuit according to claim 3,
   wherein the control unit increases the ratio such that the circuit threshold of the input buffer becomes greater than a reference value when the level of the signal fed back by the feedback unit is H level, and decreases the ratio such that the circuit threshold of the input buffer becomes smaller than the reference value when the level of the signal fed back by the feedback unit is L level.

5. The input circuit according to claim 4,
   wherein the control unit performs at least one of an operation of increasing a sum of dimensions of the one or more PMOS transistors and an operation of decreasing a sum of dimensions of the one or more NMOS transistors when the level of the signal fed back by the feedback unit is H level, and performs at least one of an operation of decreasing the sum of dimensions of the one or more PMOS transistors and an operation of increasing the sum of dimensions of the one or more NMOS transistors when the level of the signal fed back by the feedback unit is L level.

6. The input circuit according to claim 5,
wherein the control unit performs at least one of an operation of increasing the number of PMOS transistors which are controlled so as to enter an operable state and an operation of decreasing the number of NMOS transistors which are controlled so as to enter an operable state when the level of the signal fed back by the feedback unit is H level, and performs at least one of an operation of decreasing the number of PMOS transistors which are controlled so as to enter an operable state and an operation of increasing the number of NMOS transistors which are controlled so as to enter an operable state when the level of the signal fed back by the feedback unit is L level.

7. The input circuit according to claim 5,
wherein the control unit performs at least one of an operation of increasing a sum of channel widths of the PMOS transistors which are controlled so as to enter an operable state and an operation of decreasing a sum of channel widths of the NMOS transistors which are controlled so as to enter an operable state when the level of the signal fed back by the feedback unit is H level, and performs at least one of an operation of decreasing the sum of channel widths of the PMOS transistors which are controlled so as to enter an operable state and an operation of increasing the sum of channel widths of the NMOS transistors which are controlled so as to enter an operable state when the level of the signal fed back by the feedback unit is L level.

8. The input circuit according to claim 5,
wherein the control unit performs at least one of an operation of decreasing a sum of channel lengths of the PMOS transistors which are controlled so as to enter an operable state and an operation of increasing a sum of channel lengths of the NMOS transistors which are controlled so as to enter an operable state when the level of the signal fed back by the feedback unit is H level, and performs at least one of an operation of increasing the sum of channel lengths of the PMOS transistors which are controlled so as to enter an operable state and an operation of decreasing the sum of channel lengths of the NMOS transistors which are controlled so as to enter an operable state when the level of the signal fed back by the feedback unit is L level.

9. The input circuit according to claim 1,
wherein the holding unit holds the levels of a plurality of signals transferred from the input buffer at a plurality of clock cycles of the clock signal and outputs the levels of the plurality of transferred signals before a plurality of clock cycles,
wherein the feedback unit feeds the levels of the plurality of transferred signals before the plurality of clock cycles output by the holding unit back to the control unit, and
wherein the control unit changes dynamically the selected one or more PMOS transistors and the selected one or more NMOS transistors in accordance with the fed-back levels of the plurality of transferred signals before the plurality of clock cycles.

10. The input circuit according to claim 9,
wherein the control unit changes dynamically the one or more PMOS transistors to be selected and the one or more NMOS transistors to be selected such that a changing amount of the dimensions in accordance with a level of a new signal is larger than a changing amount of the dimensions in accordance with a level of a old signal among the fed-back levels of the plurality of transferred signals before the plurality of clock cycles.

11. The input circuit according to claim 1,
wherein the control unit includes:
a decoding unit that decodes the level of the transferred signal fed back by the feedback unit; and
a plurality of switches that selects one or more PMOS transistors from the plurality of PMOS transistors so as to enter an operable state and selects one or more NMOS transistors from the plurality of NMOS transistors so as to enter an operable state in accordance with the output of the decoding unit.

12. The input circuit according to claim 11,
wherein the decoding unit includes:
a first decoding unit that is arranged in a side of the plurality of PMOS transistors; and
a second decoding units that is arranged in a side of the plurality of NMOS transistors,
wherein the plurality of switches includes:
a plurality of first switches that selects one or more PMOS transistors from the plurality of PMOS transistors so as to enter an operable state in accordance with the decoding result by the first decoding unit; and
a plurality of second switches that selects one or more NMOS transistors from the plurality of NMOS transistors so as to enter an operable state in accordance with the decoding result by the second decoding unit.

13. The input circuit according to claim 1,
wherein the control unit adjusts a circuit threshold of the input buffer so as to be approximately identical to a reference value during initial setup, controls the circuit threshold of the input buffer so as to be greater than the reference value when the level of the signal fed back by the feedback unit is H level, and controls the circuit threshold of the input buffer so as to be smaller than the reference value when the level of the signal fed back by the feedback unit is L level.

14. A semiconductor storage device comprising:
a semiconductor storage element including the input circuit according to claim 1; and
a controller that supplies a test pattern to the input circuit during initial setup of the input circuit,
wherein the input circuit adjusts a circuit threshold of an input buffer in the input circuit so as to be approximately identical to a reference value using the test pattern supplied by the controller.

15. The semiconductor storage device according to claim 14,
wherein the controller transfers the test pattern to the input circuit at a first transfer rate, and transfers a command regarding a test operation to the input circuit at a second transfer rate slower than the first transfer rate during the initial setup.

16. The semiconductor storage device according to claim 14,
wherein the semiconductor storage element compares an output signal pattern of the input circuit in response to the test pattern with a correct answer pattern, and transfers the comparison result to the controller during the initial setup,
wherein the controller transfers a change command for notifying that an operation condition is to be changed to the input circuit during the initial setup when the output signal pattern is not identical to the correct answer pattern, and wherein the input circuit adjusts a circuit threshold of the input buffer in the input circuit so as to be approximately identical to a reference value in accordance with the transferred change command.

17. The semiconductor storage device according to claim 16, wherein the controller transfers the test pattern to the input circuit at a first transfer rate, and transfers the correct answer pattern to the input circuit at a second transfer rate slower than the first transfer rate during the initial setup.

18. The semiconductor storage device according to claim 14, wherein the controller transfers predetermined data for one clock cycle to the input circuit before transferring writing data during an actual operation.

19. The semiconductor storage device according to claim 14, wherein the semiconductor storage element further includes a dummy input circuit for automatically setting the circuit threshold of the input buffer in the input circuit to the reference value.

20. The semiconductor storage device according to claim 14, wherein the semiconductor storage element further includes an output circuit, and wherein the input circuit adjusts the circuit threshold of the input buffer in the input circuit so as to be approximately identical to the reference value in a state a driving capability of the output circuit during the initial setup is deteriorated from a driving capability during an actual operation.

* * * * *